United States Patent
Katakura et al.

(10) Patent No.: US 8,432,700 B2
(45) Date of Patent: Apr. 30, 2013

(54) STORAGE APPARATUS

(75) Inventors: Yasuyuki Katakura, Odawara (JP);
Yasuji Morisita, Odawara (JP)

(73) Assignee: Hitachi, Ltd., Tokyo (JP)

( * ) Notice: Subject to any disclaimer, the term of this patent is extended or adjusted under 35 U.S.C. 154(b) by 161 days.

(21) Appl. No.: 12/743,437

(22) PCT Filed: May 10, 2010

(86) PCT No.: PCT/JP2010/003158
§ 371 (c)(1),
(2), (4) Date: May 18, 2010

(87) PCT Pub. No.: WO2011/141950
PCT Pub. Date: Nov. 17, 2011

(65) Prior Publication Data
US 2011/0273835 A1    Nov. 10, 2011

(51) Int. Cl.
*H05K 5/00* (2006.01)
(52) U.S. Cl.
USPC .......... 361/732; 361/726; 361/759; 62/259.2; 312/223.2; 700/302
(58) Field of Classification Search ............. 361/679.33, 361/679.46–679.51, 679.57–679.58, 688–690, 361/695, 701, 707, 724–732, 752, 755, 759
See application file for complete search history.

(56) References Cited

U.S. PATENT DOCUMENTS

| | | | | |
|---|---|---|---|---|
| 6,791,836 B2* | 9/2004 | Cipolla et al. | ............ | 361/679.48 |
| 7,430,117 B2* | 9/2008 | Shabany | ....................... | 361/695 |
| 7,961,463 B2* | 6/2011 | Belady et al. | ................. | 361/695 |
| 2003/0227757 A1* | 12/2003 | Vincent et al. | ................. | 361/796 |
| 2005/0111136 A1 | 5/2005 | Miyamoto et al. | | |
| 2005/0168945 A1* | 8/2005 | Coglitore | ....................... | 361/695 |
| 2005/0259460 A1 | 11/2005 | Sone | | |
| 2007/0006239 A1 | 1/2007 | Kasahara et al. | | |
| 2008/0043426 A1 | 2/2008 | Nishiyama et al. | | |
| 2009/0059520 A1 | 3/2009 | Tanaka et al. | | |
| 2009/0067127 A1* | 3/2009 | Katakura et al. | ......... | 361/679.33 |
| 2009/0294107 A1* | 12/2009 | Nishiyama et al. | ...... | 165/104.34 |
| 2010/0053879 A1* | 3/2010 | Miyamoto et al. | ........ | 361/679.31 |
| 2011/0149500 A1* | 6/2011 | Miyamoto et al. | ........ | 361/679.31 |

FOREIGN PATENT DOCUMENTS

| | | |
|---|---|---|
| EP | 1 746 483 A1 | 1/2007 |
| EP | 2 128 738 A2 | 12/2009 |
| JP | 2007-11931 A | 1/2007 |
| JP | 2008-47249 A | 2/2008 |

* cited by examiner

*Primary Examiner* — Courtney Smith
(74) *Attorney, Agent, or Firm* — Mattingly & Malur, PC

(57) ABSTRACT

A storage apparatus includes: a front disk unit for receiving a first modular inserted from the front face of a general purpose chassis into a space with a plurality of first cooling devices in an opened state; and a rear disk unit for receiving a second modular inserted from the back face of the general purpose chassis into a space with a plurality of second cooling devices in an opened state. Furthermore, the storage apparatus includes a regulating member for regulating, according to an open-close state of at least one cooling device from among the plurality of openable first cooling devices and the plurality of openable second cooling devices which are provided to face the front face and back face of the general purpose chassis, respectively, an open-close state of the remaining cooling devices.

9 Claims, 46 Drawing Sheets

FIG.26

| HDDBOX ADDRESS | HDD ADDRESS | FAN ADDRESS | HDDBOX ADDRESS | HDD ADDRESS | FAN ADDRESS |
|---|---|---|---|---|---|
| HDDxy0 | 00 | HDDFAN-xy0 | HDDxy4 | 00 | HDDFAN-xy0 |
|  | 01 |  |  | 01 |  |
|  | 02 |  |  | 02 |  |
|  | 03 |  |  | 03 |  |
|  | 04 |  |  | 04 |  |
|  | 05 |  |  | 05 |  |
|  | 06 |  |  | 06 |  |
|  | 07 |  |  | 07 |  |
|  | 08 |  |  | 08 |  |
|  | 09 |  |  | 09 |  |
|  | 0A |  |  | 0A |  |
|  | 0B |  |  | 0B |  |
|  | 0C |  |  | 0C |  |
|  | 0D |  |  | 0D |  |
|  | 0E |  |  | 0E |  |
|  | 0F |  |  | 0F |  |
| HDDxy1 | 00 | HDDFAN-xy1 | HDDxy5 | 00 | HDDFAN-xy5 |
|  | 01 |  |  | 01 |  |
|  | 02 |  |  | 02 |  |
|  | 03 |  |  | 03 |  |
|  | 04 |  |  | 04 |  |
|  | 05 |  |  | 05 |  |
|  | 06 |  |  | 06 |  |
|  | 07 |  |  | 07 |  |
|  | 08 |  |  | 08 |  |
|  | 09 |  |  | 09 |  |
|  | 0A |  |  | 0A |  |
|  | 0B |  |  | 0B |  |
|  | 0C |  |  | 0C |  |
|  | 0D |  |  | 0D |  |
|  | 0E |  |  | 0E |  |
|  | 0F |  |  | 0F |  |
| HDDxy2 | 00 | HDDFAN-xy2 | HDDxy6 | 00 | HDDFAN-xy6 |
|  | 01 |  |  | 01 |  |
|  | 02 |  |  | 02 |  |
|  | 03 |  |  | 03 |  |
|  | 04 |  |  | 04 |  |
|  | 05 |  |  | 05 |  |
|  | 06 |  |  | 06 |  |
|  | 07 |  |  | 07 |  |
|  | 08 |  |  | 08 |  |
|  | 09 |  |  | 09 |  |
|  | 0A |  |  | 0A |  |
|  | 0B |  |  | 0B |  |
|  | 0C |  |  | 0C |  |
|  | 0D |  |  | 0D |  |
|  | 0E |  |  | 0E |  |
|  | 0F |  |  | 0F |  |
| HDDxy3 | 00 | HDDFAN-xy3 | HDDxy7 | 00 | HDDFAN-xy7 |
|  | 01 |  |  | 01 |  |
|  | 02 |  |  | 02 |  |
|  | 03 |  |  | 03 |  |
|  | 04 |  |  | 04 |  |
|  | 05 |  |  | 05 |  |
|  | 06 |  |  | 06 |  |
|  | 07 |  |  | 07 |  |
|  | 08 |  |  | 08 |  |
|  | 09 |  |  | 09 |  |
|  | 0A |  |  | 0A |  |
|  | 0B |  |  | 0B |  |
|  | 0C |  |  | 0C |  |
|  | 0D |  |  | 0D |  |
|  | 0E |  |  | 0E |  |
|  | 0F |  |  | 0F |  |

[Fig. 33]

STORAGE APPARATUS

TECHNICAL FIELD

The present invention relates to a storage apparatus. Particularly, the present invention is suited for use in a storage apparatus containing hard disk drives in both the front and back faces of a general purpose chassis.

BACKGROUND ART

A system dealing with data on a large scale like a system in a data center manages data by using host computers and storage apparatuses. A storage apparatus has hard disk drives arranged in an array and manages the plurality of hard disk drives according to the RAID, thereby protecting the data.

Regarding conventional storage apparatuses, the number of hard disk drives mounted in a storage apparatus has been increasing in association with an increase in the amount of data to be handled by the storage apparatus. For example, a conventional storage apparatus has a plurality of hard disk drives mounted in a dedicated chassis (see Patent Literature 1).

In this type of storage apparatus, the air supplied from outside the chassis into the chassis is made to flow through flow paths formed in the chassis to cool the hard disk drives and then the air is discharged from a fan unit on the top surface of the chassis.

On the other hand, there is another type of storage apparatus in which a user sequentially adds modulars equipped with hard disk drives not to a dedicated chassis, but to a general purpose chassis (see Patent Literature 2).

In the conventional storage apparatus which uses the general purpose chassis, exhaust fans cannot be provided on the top surface of the chassis and air flow paths cannot be formed inside the chassis. Therefore, the conventional storage apparatus is configured so that a modular in which a power source and fans are integrated with hard disk drives is placed in the chassis. Such a modular is inserted from the front side of a rack into the chassis. Cooling air is introduced through the front face of a module into the rack and then discharged from the back face of the module.

CITATION LIST

[Patent Literature]
[PTL 1]
Japanese Patent Laid-Open (Kokai) Application Publication No. 2008-47249
[PTL 2]
Japanese Patent Laid-Open (Kokai) Application Publication No. 2007-11931

SUMMARY OF INVENTION

Technical Problem

The conventional storage apparatus may be configured so that the fans can be opened or closed in order to facilitate maintenance work such as replacement of the modular described above, but the following problem may possibly occur. That is, if any of the fans is opened in such a storage apparatus during the maintenance work, its cooling ability decreases at least temporarily and, therefore, stable cooling performance cannot be secured.

This invention was devised in light of the circumstances described above and aims at suggesting a storage system capable of securing stable cooling performance.

Solution to Problem

In order to solve the above-described problem, a storage apparatus comprising: a general purpose chassis having a space in its front face and a space in its back face; a plurality of openable first cooling devices provided so as to face the front face of the general purpose chassis; a plurality of openable second cooling devices provided so as to face the back face of the general purpose chassis; a front disk unit for receiving a first modular, which is inserted from the front face of the general purpose chassis into the space with the plurality of first cooling devices in an opened state, and in which a plurality of first containers receiving a plurality of first storage devices, are formed; a rear disk unit for receiving a second modular, which is inserted from the back face of the general purpose chassis into the space with the plurality of second cooling devices in an opened state, and in which a plurality of second containers receiving a plurality of second storage devices, are formed; and a regulating member for regulating, according to an open-close state of at least one cooling device from among the plurality of first cooling devices and the plurality of second cooling devices, an open-close state of the remaining cooling devices.

Advantageous Effects of Invention

According to the present invention, stable cooling performance can be secured.

BRIEF DESCRIPTION OF DRAWINGS

FIG. 26 is a chart showing an example of the positional correspondence relationship shown in FIG. 22 through FIG. 25.

DESCRIPTION OF EMBODIMENTS (1) Storage Apparatus in the Present Embodiment (1-1) Concept of the Present Embodiment Various configurations can be used in the present embodiment as described later in order to secure stable cooling performance of hard disk drives. As an example of such configurations, a configuration to regulate an opening of openable cooling devices for disk units in a storage apparatus is used. A prerequisite configuration that is the basis of the above-described configuration will be explained first and then, for example, a regulating member for regulating an opening of the openable cooling devices as mentioned above will be explained.

(1-2) Entire External Appearance

Figure 1:
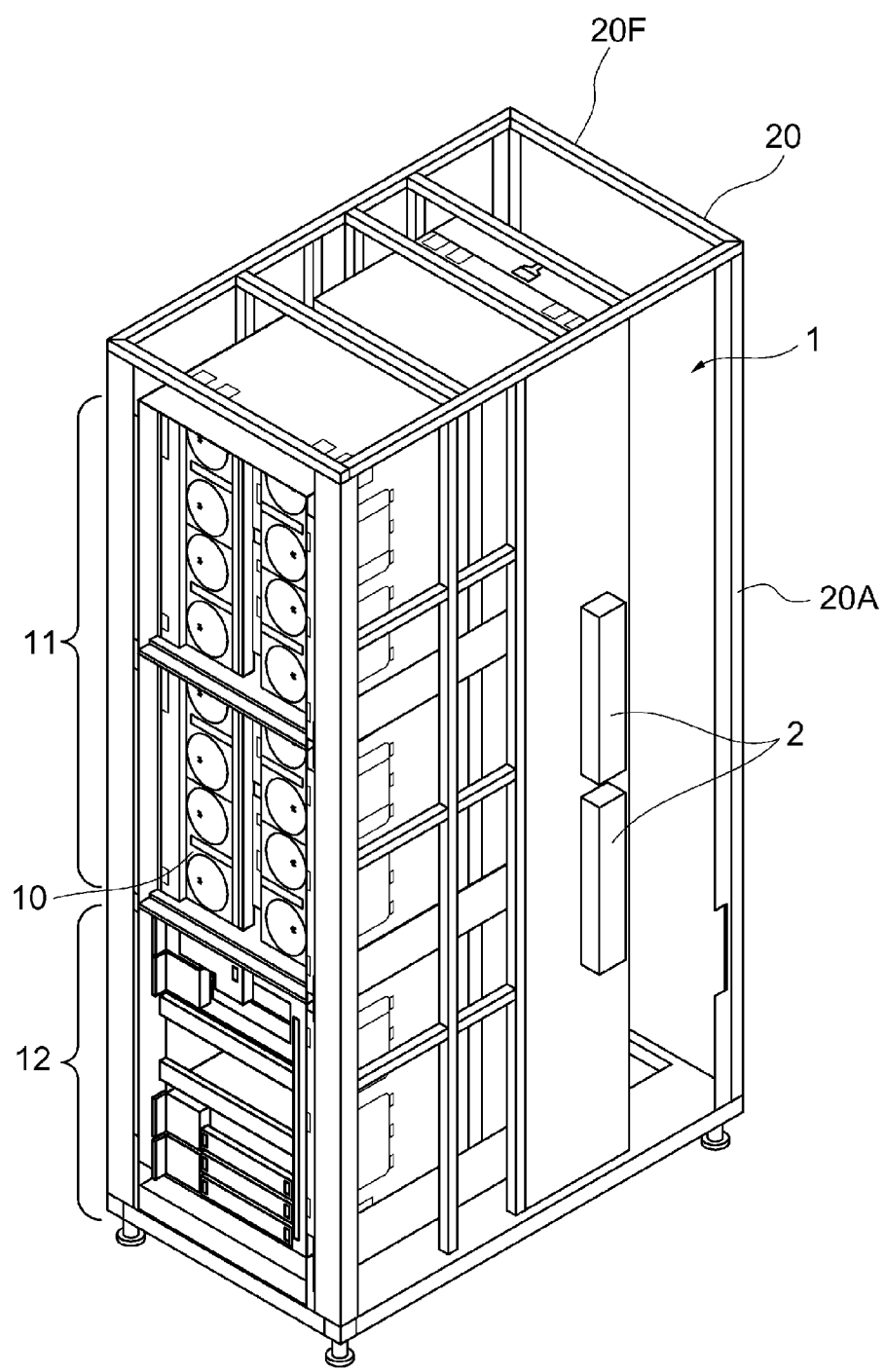
FIG. 1 is a perspective view showing the entire configuration of a storage apparatus according to the present embodiment.

FIG. 1 is a perspective view showing the entire configuration of a storage apparatus 1 in the present embodiment. This storage apparatus 1 is of a rack mount type in which the storage apparatus 1 is mounted in a rack 20. This rack 20 is configured as a hollow rectangular parallelepiped formed with frames.

Disk units 11 and a disk controller (DKC) 12 are placed in the rack 20. These disk units 11 and disk controller 12 are fixed to the frames 20A. Two power sources 2 are provided on the side face of the rack 20. The power source 2 supplies electric power to the disk units 11 and the disk controller 12 or stops the power supply. The disk controller 12 executes I/O processing on input to, or output from, a host computer (not shown) and executes a data write request or read request on the disk units 11 having a plurality of hard disk drives.

In the storage apparatus 1 according to the present embodiment, the disk controller 12, a basic disk unit 11, and an additional disk unit 11 are placed one on top of the other in the order listed above from the bottom of the rack 20 upwards. Furthermore, another storage apparatus can be added, if needed, to the above-described storage apparatus 1 by adding another rack 20 next to the above-described rack 20. The disk controller 12 is connected to the disk units 11 as described later and controls writing data to the disk units 11 and reading data from the disk units 11. The number and configuration (such as connection configuration) of the disk unit(s) 11 and the disk controller(s) 12 can be changed according to a request from the user.

Regarding the disk unit 11 in the present embodiment, a front disk unit 11 on the front face side of the rack 20 and a rear disk unit 11 on the back face side of the rack 20 are placed with their respective back faces opposite to each other. Accordingly, in the example shown in the drawing, four disk units 11 are mounted on top of the disk controller 12 placed at the lower part of the rack 20. The detailed configuration of the disk unit 11 will be explained later.

Figure 2:
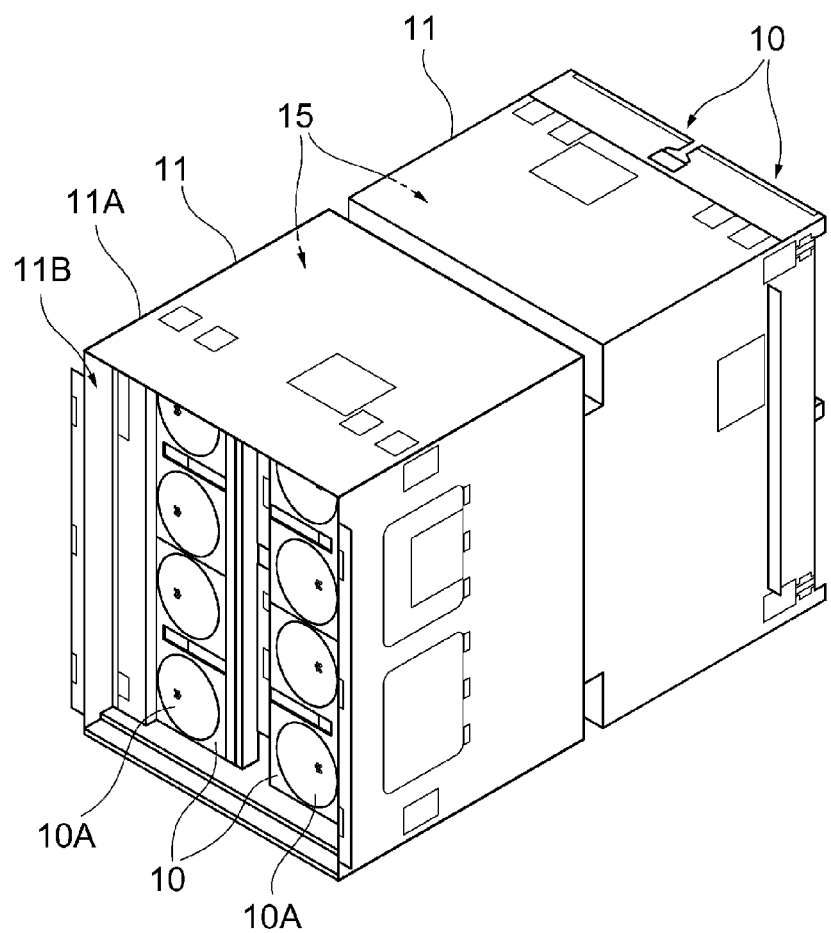
FIG. 2 is a perspective view showing a configuration example for disk units.

FIG. 2 shows a configuration example for the disk units 11. The disk unit 11 has hard disks 15 inside a chassis 11A with its one side open. Fan assemblies 10 as cooling devices are placed in an opening 11B in the disk unit 11. Two fan assemblies 10 are placed separately, one on the right side and the other on the left side, in the opening 11B. One fan assembly 10 is configured to be long in a vertical direction and includes, for example, four fans 10A along the vertical direction. The two fan assemblies 10 placed side by side in the opening 11B are opened or closed as described later. In the following explanation, the disk units 11 are configured so that the fan assemblies 10 on the front face side introduce the outside air into the disk unit 11 and the fan assemblies on the back face side discharge the air from the disk unit 11.

Figure 3:
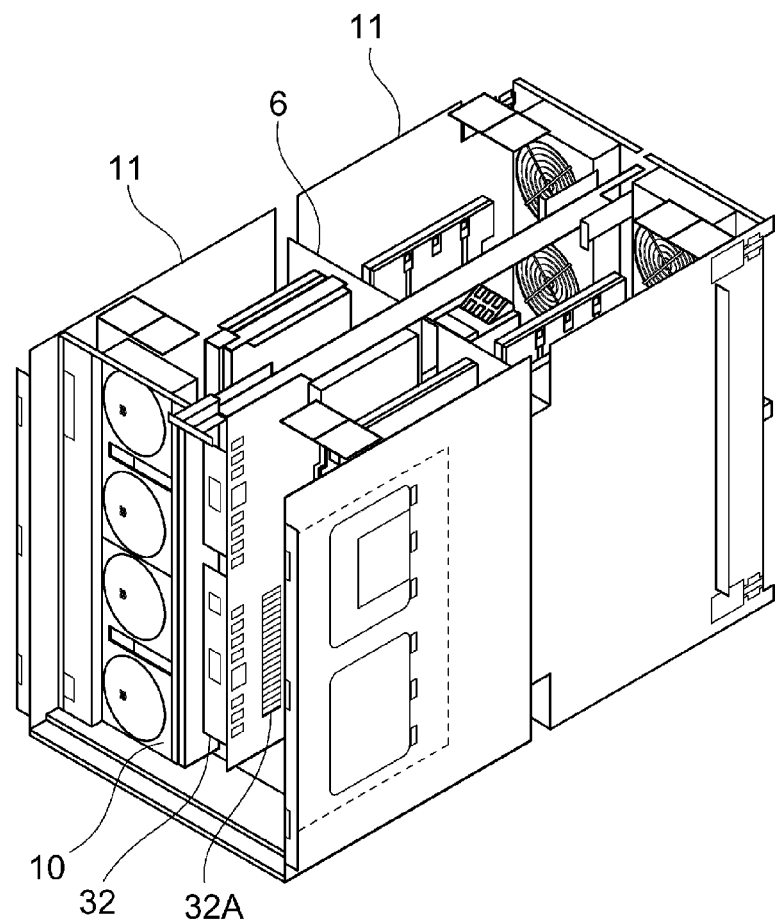
FIG. 3 is a perspective view showing a configuration example for the disk units with the top board of a chassis removed.

FIG. 3 shows a configuration example for the disk units 11 without a top board of the chassis 11A. Incidentally, the fan assembly 10 on the right side in the front disk unit 11 is omitted in the example shown in the drawing. The front disk unit 11 and the rear disk unit 11 are placed with their respective back faces opposite to each other as described above, and a back board 6 is placed on the back faces. Incidentally, when it is unnecessary to distinguish these disk units 11, they may be simply referred to as the disk unit 11. If the disk unit 11 is divided into the front unit and the rear unit as described above, the weight of each disk unit 11 is reduced, thereby making it easier to do the work. The disk unit 11 is configured so that the aforementioned hard disk drives 15 are mounted on the back board 6. Incidentally, the hard disk drives 15 are not shown in FIG. 3.

Furthermore, as seen from the front face, the disk unit 11 is provided with a power source 32 at the center of the disk unit 11 in the horizontal direction (widthwise direction) of the disk unit 11. The power source 32 supplies electric power to, for example, the hard disk drives 15 or stops the power supply. An opening 32A for taking in the air to cool the power source is formed on the side face of this power source 32.

Figure 4:
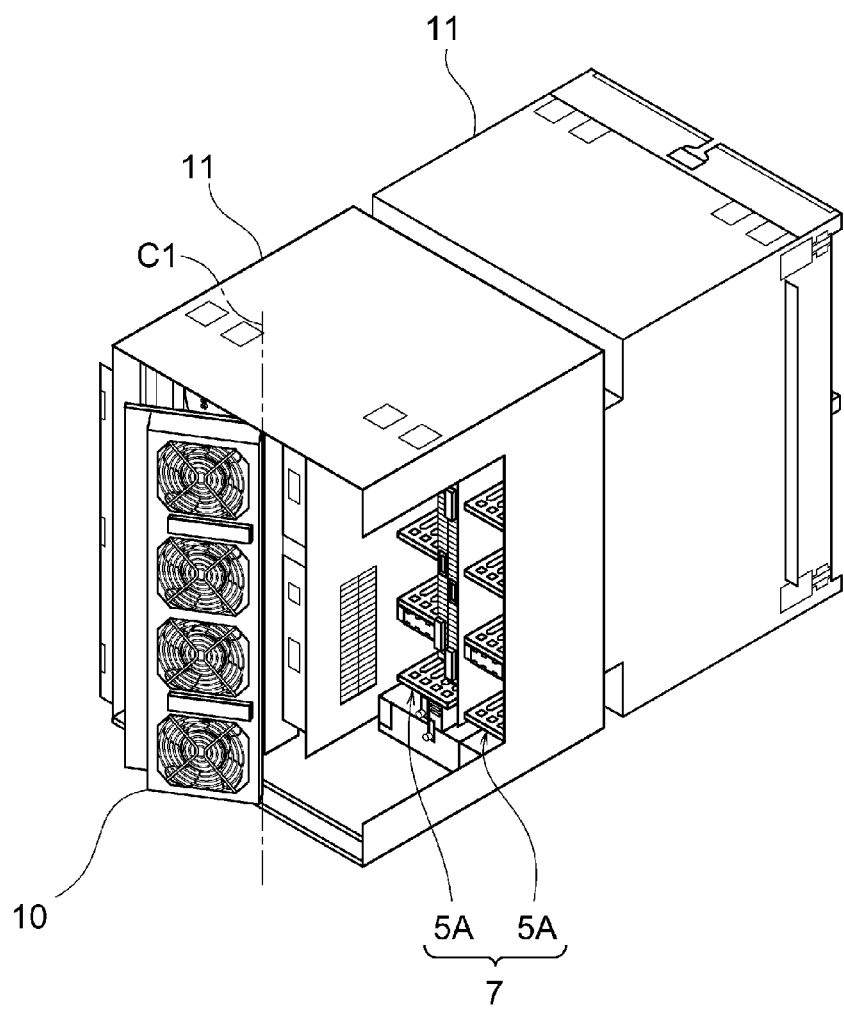
FIG. 4 is a perspective view showing the state where one of fan assemblies for the disk unit is opened.

FIG. 4 shows the state where one fan assembly 10 of the disk unit 11 is opened. Incidentally, in the example shown in the drawing, the other fan assembly 10 is omitted and a cover of the opened fan assembly 10 is removed so that the inside components are exposed. Also, the right side wall of the disk unit 11 is removed.

The left fan assembly 10 is configured to open or close when operated by the user by swinging around axis C1 located at the center of the opening 11B in the horizontal direction of the disk unit 11 and extends in its vertical direction. On an aside, the right fan assembly 10 opens or closes in almost the same configuration as that of the left fan assembly 10.

A hard disk box is inserted into the right half portion of the disk unit 11, and this hard disk box has, for example, two containers 5A arranged side by side in the horizontal direction of the disk unit 11. The hard disk box is a container for holding the aforementioned hard disk drives 15. This container 5A will be described later.

(1-3) Hard Disk Box

Figure 5:
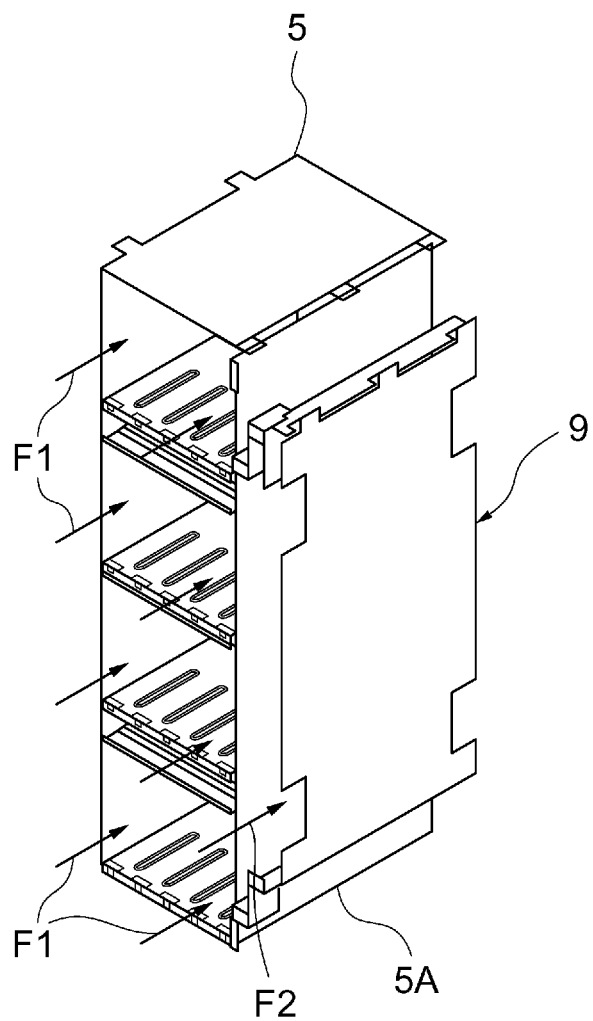
FIG. 5 is a perspective view showing a configuration example for a hard disk box.

FIG. 5 shows a configuration example for a hard disk box 7. The hard disk box 7 is configured so that a plurality of hard disk drives 15 (each of which corresponds to a canister described later) can be mounted on each of four rows arranged in the vertical direction of the hard disk box 7. This hard disk box 7 can allow the cooling air flow F1 formed by the fan assembly 10 in the closed state to pass through.

A bypass chamber 9, which will be described later as an example of a specified chamber, is placed on one side face of the hard disk box 7. This bypass chamber 9 is a hollow portion designed to form flow F2 that will not contact the hard disk drives 15, besides the flow F1 passing through the area where the hard disk drives 15 (not show) are arranged. The details of the bypass chamber 9 will be explained later.

(1-4) Internal Configuration

Figure 6:
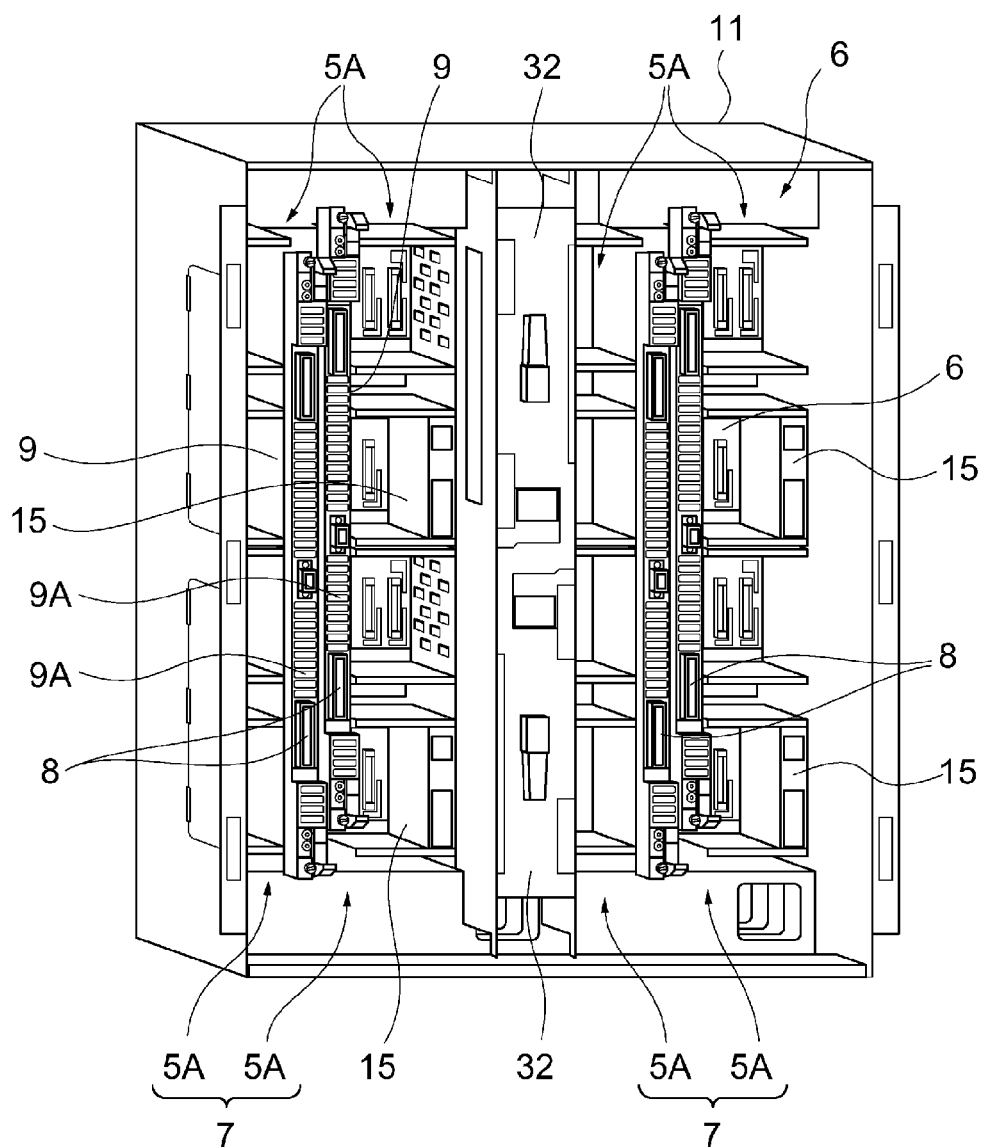
FIG. 6 is a perspective view showing an internal configuration example for the disk unit.

FIG. 6 shows an internal configuration example for the disk unit 11. Incidentally, FIG. 6 shows the configuration of the disk unit 11 without the two fan assemblies 10. Each hard disk box 7 has the bypass chamber 9 between the containers 5A placed side by side relative to the horizontal direction of the hard disk box 7. This bypass chamber 9 has an intake port 9A that is open on the front face side. Each intake port 9A has, for example, two SAS switches 8. Many slits are formed in the intake port 9A. The air introduced by the intake fan assembly 10 enters through the intake port 9A into a hollow area in the bypass chamber 9 and flows further into the hollow area.

Figure 7:
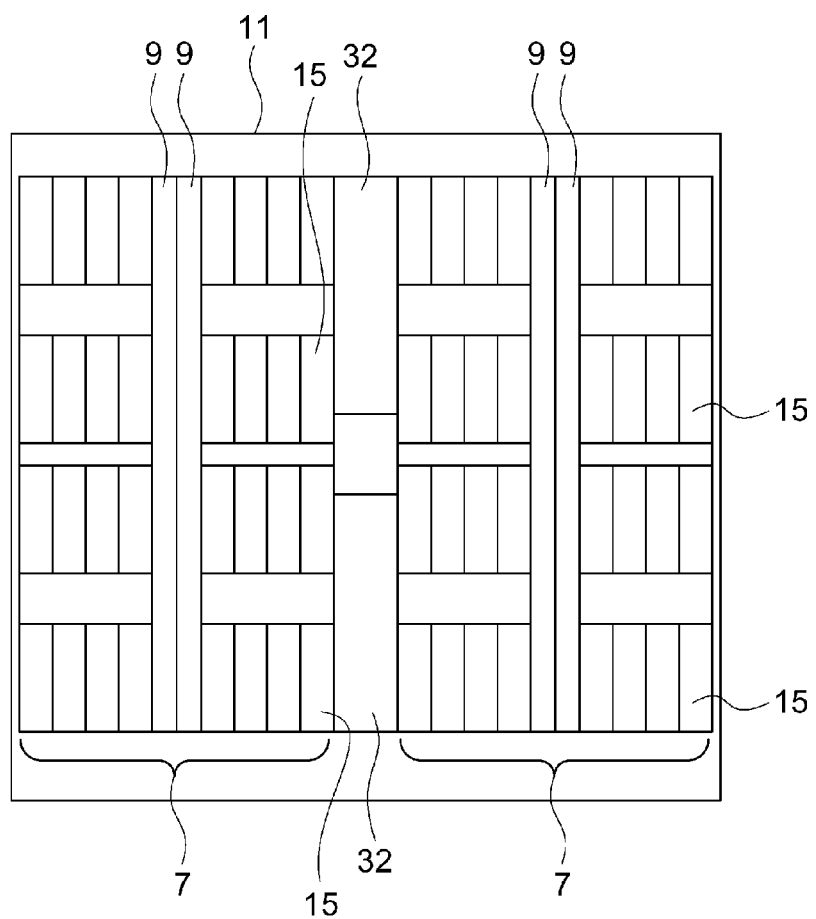
FIG. 7 is a simplified plan view of the front face of the disk unit.

FIG. 7 shows an example of a simplified configuration of the disk unit 11 as seen from the front face. The disk unit 11 is configured so that its right and left portions are substantially symmetrical to each other with respect to the power source 32 at the center of the disk unit 11 relative to its horizontal direction. If such a configuration is used, each wiring pattern and each wiring length to the power source 32 can be made uniform and the best signal transmission and reception efficiency can be realized. Furthermore, each of the right and left portions of the disk unit 11 which are divided by the power source 32 is configured so that half portions of the right portion or the left portion, which are divided by the bypass chamber 9 in the middle, are substantially symmetrical to each other with respect to the bypass chamber 9.

(1-5) Air Flow Passage

Figure 8:
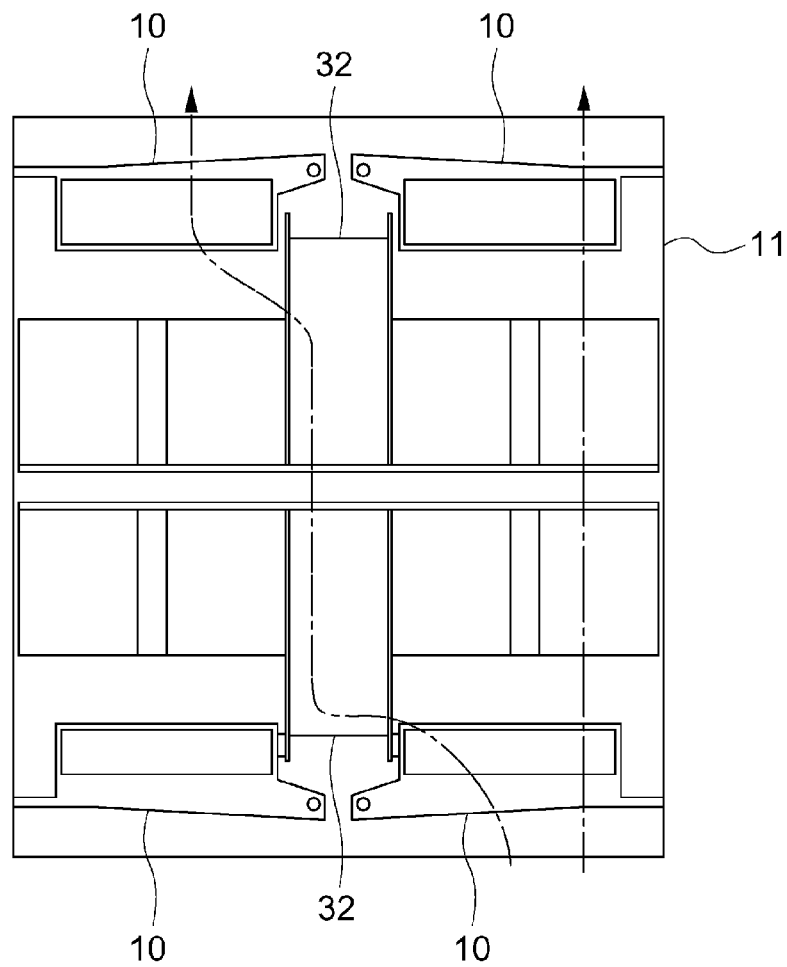
FIG. 8 is a simplified plan view of the front face of the disk unit.

FIG. 8 is a plan view showing a simplified configuration of the disk unit 11 as seen from above. Incidentally, FIG. 8 shows the example in which the top board is removed. Part of the air introduced by the intake fan assemblies 10 into the disk unit 11 passes through the space where the hard disk drives 15 in the hard disk boxes 7 are located in the front disk unit 11, while the rest of the air passes through the space in the bypass chambers 9 in the front disk unit 11. In the following explanation, the space where the hard disk drives 15 in the hard disk boxes 7 are located will be referred to as the drive-located space (HDD-mounted portion), and the space in the bypass chamber 9 will be referred to as the chamber space (SSW-mounted portion). The disk unit 11 is configured so that the air passing through the bypass chamber 9 will pass through the drive-located space in the rear disk unit 11.

(1-6) Internal Configuration

Figure 9:
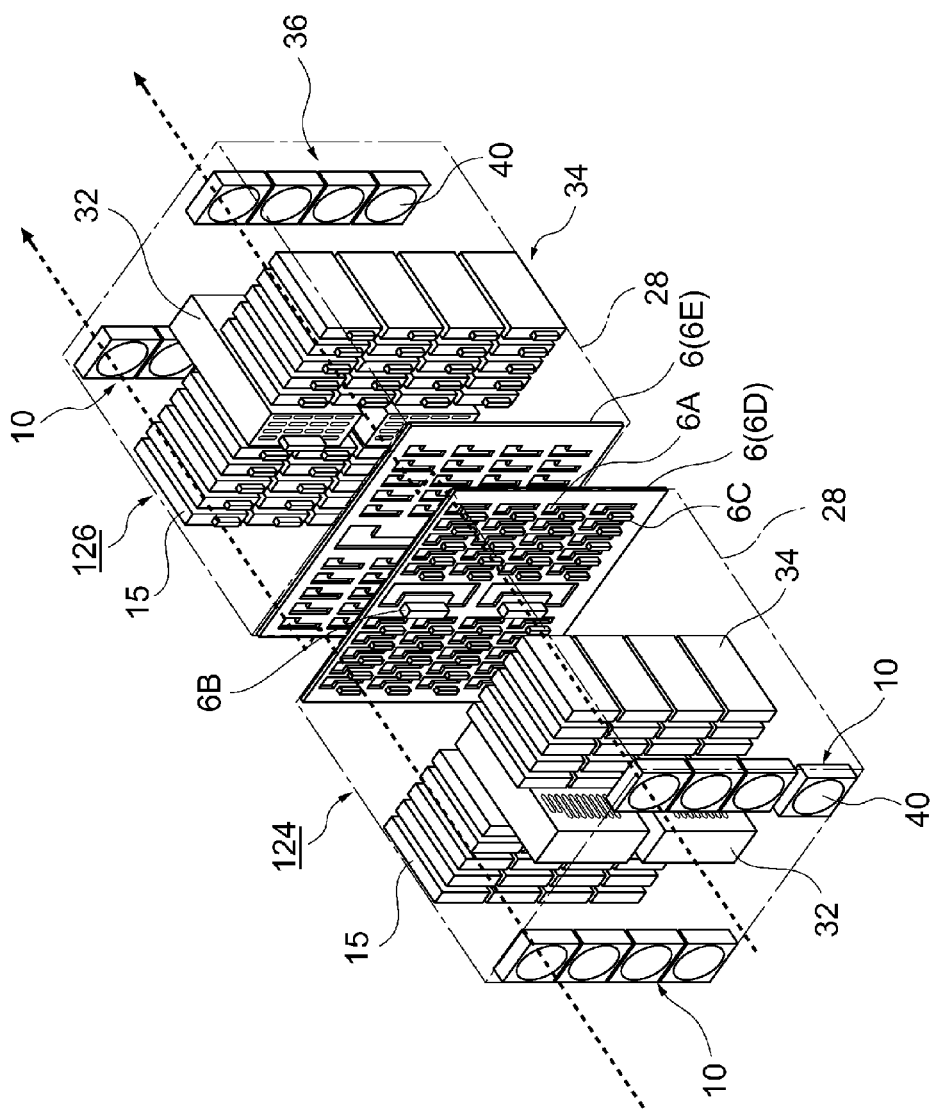
FIG. 9 is an exploded perspective view of a modular for a front disk unit and modular for a rear disk unit.

FIG. 9 is an exploded perspective view of a modular 124 for the front disk unit 11 and a modular 126 for the rear disk unit 11. Each modular 124, 126 is inserted from the front face or back face of the chassis 11A respectively, with the fan assembly 10 opened relative to the chassis 11A, into the space in the chassis 11A and mounted on the back board 6. Incidentally, since the front disk unit 11 and the rear disk unit 11 have similar configurations, the following explanation will focus on the front disk unit 11.

The back board 6 is a plate-like member in which vent holes 6A are formed. Two connectors 6B are provided at the central part of the plate-like member and arranged in the vertical direction, and many SATA connectors 6C are placed on both right and left half portions of the back board 6 divided by its central part. FIG. 9 shows the back board 6 by rather simplifying the configuration of, for example, the vent holes 6A, and the detailed configuration of the back board 6 will be explained later. Also, in the following explanation, the back board 6 for the front disk unit 11 will be referred to as a back board 6D, the back board 6 for the rear disk unit 11 will be referred to as a back board 6E, and these back boards 6D, 6E will be collectively referred to as the back board 6. The connector 6B is an interface for connecting the power source 32 and the SATA connector 6C is an interface for connecting the hard disk drive 15.

According to the present embodiment, the power source 32 is placed at the center of the back board 6 and a plurality of hard disk drives 15 are placed on both the right and left sides of the power source 32, so that the total length of a power supply pattern from the power source 32 to each hard disk drive 15 can be set to a small value. Therefore, it is possible to prevent an increase of the size of the back board 6. Incidentally, the back board 6 is sometimes called a platter.

(1-7) Configuration of Back Board for Front Disk Unit

Figure 10:
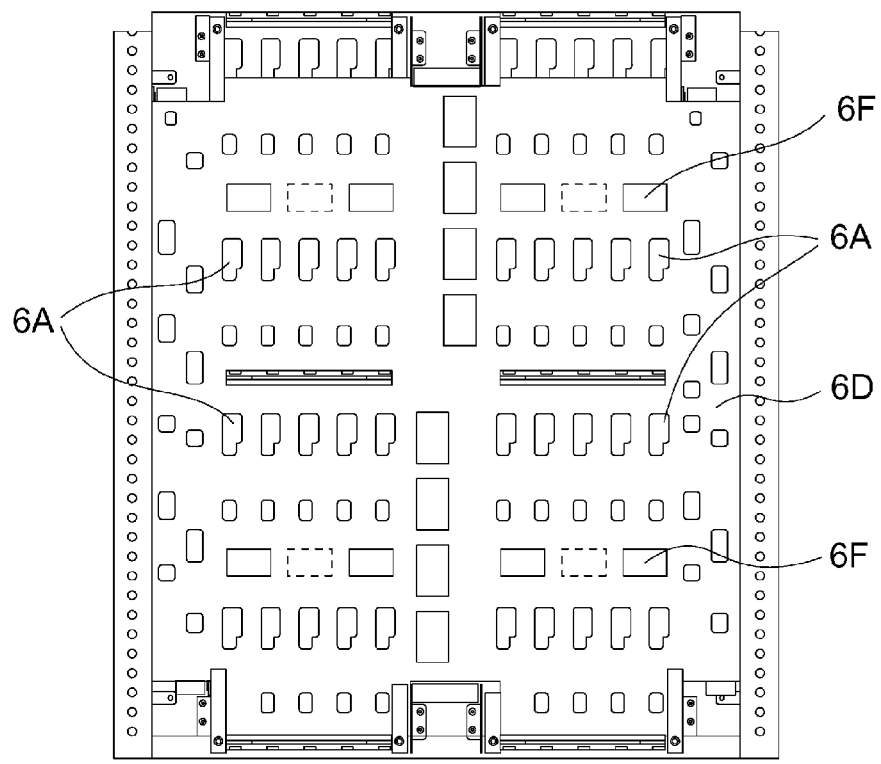
FIG. 10 is a plan view showing a configuration example for a back board of the front disk unit.

FIG. 10 shows a configuration example for the back board 6D for the front disk unit 11D. Specified vent holes 6F, other than the aforementioned vent holes 6A, are formed in the back board 6D. These specified vent holes 6F are formed to supply the air, which has passed through the bypass chamber 9 in the front disk unit 11, to the rear disk unit 11.

(1-8) Configuration of Back Board for Rear Disk Unit

Figure 11:
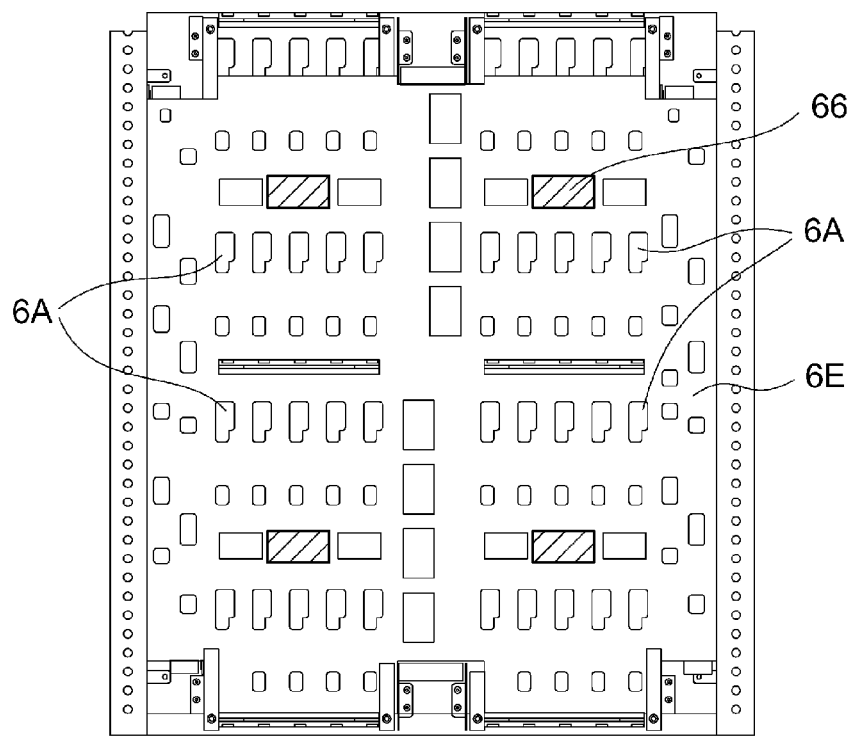
FIG. 11 is a plan view showing a configuration example for a back board of the rear disk unit.

FIG. 11 shows a configuration example for the back board 6E for the rear disk unit 11E. The aforementioned vent holes 6A are formed in the back board 6E for the rear disk unit 11E and flow path control members 66 are provided at the positions corresponding to the specified vent holes 6F in the back board 6D for the front disk unit 11D.

With this arrangement, the flow direction of the air which has passed through the specified vent holes 6F in the back board 6D for the front disk unit 11D is changed by the flow path control members 66 as described below.

(1-9) Air Flow Path

Figure 12:
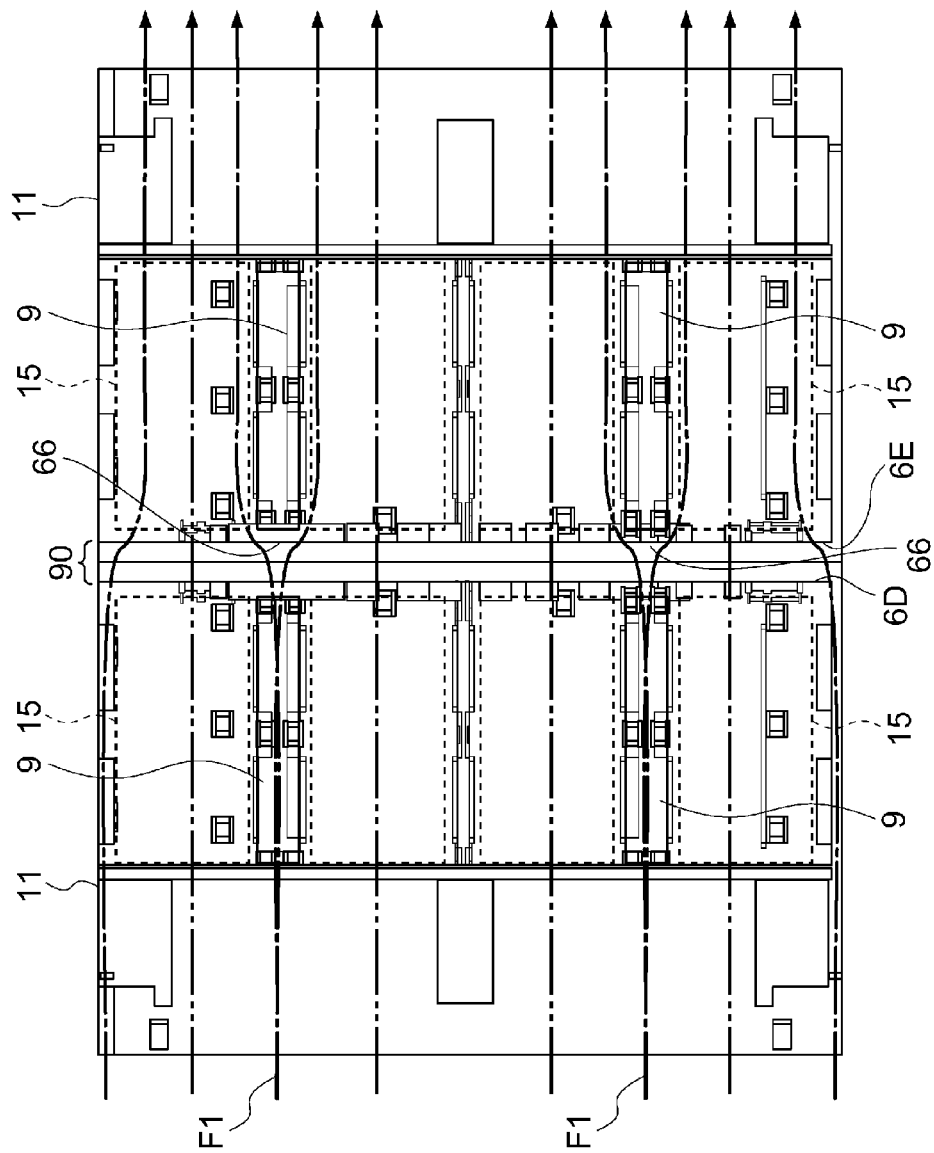
FIG. 12 is a cross-sectional view showing an example of air flow paths in the front disk unit and the rear disk unit.

FIG. 12 is a cross-sectional view showing an example of air flow paths in the front disk unit 11 and the rear disk unit 11. The example of FIG. 12 shows the cross-sectional configuration of these disk units 11 as seen from above.

In the front disk unit 11, the air F1 introduced by the intake fan assemblies 10 passes through the bypass chambers 9 without flowing near the hard disk drives 15; and then the air F1 further passes through an intermediate chamber 90 as another chamber and is supplied to the rear disk unit 11. In the rear disk unit 11, the air flow path is controlled by the flow path control members 66 provided on the back board 6E, so that the air does not flow through the bypass chambers 9 and flows through the containers (corresponding to the hard disk boxes) for the hard disk drives 15. Since the air flowing through the containers (corresponding to the hard disk boxes) for the rear disk unit 11 has not passed near the hard disk drives 15 in the front disk unit 11, the cooling efficiency in the rear disk unit 11 can be enhanced.

Figure 13:
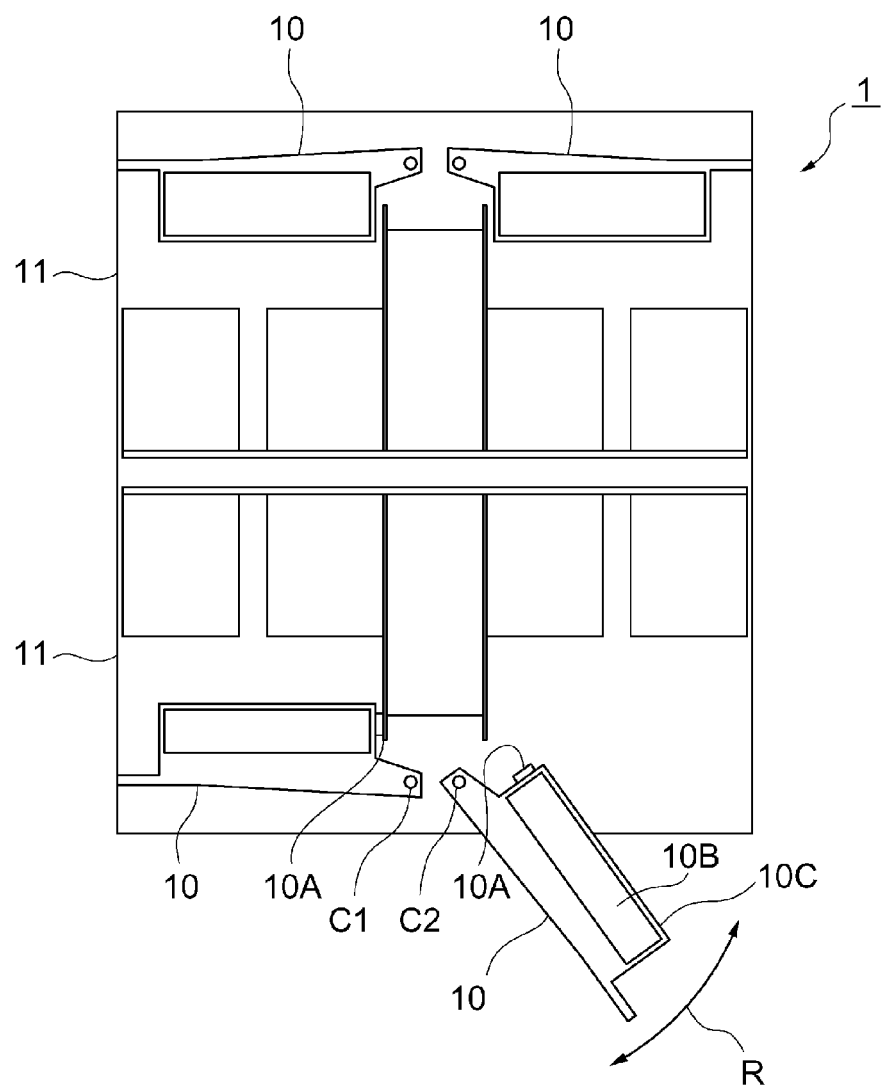
FIG. 13 is a plan view showing the state where one fan assembly is opened in the front disk unit.

FIG. 13 shows the state where one fan assembly 10 for the front disk unit 11 is opened. Incidentally, a lock mechanism described later is omitted in the configuration shown in the drawing. Since the front disk unit 11 and the rear disk unit 11 have almost the same configuration and both the right and left fan assemblies 10 also have almost the same configuration, the following explanation will focus on the fan assembly 10 for the front disk unit 11 as a representative example.

The fan assembly 10 is opened or closed on specified conditions when operated by the user as it swings in R directions around axis C2 relative to the chassis 11A. The fan assembly 10 contains fan units 10B in a chassis 100. The chassis 10C has a fan switch 10A on its back side near the axis C2. When the fan assembly 10 is closed relative to the chassis 11A, the fan switch 10A comes into contact with part of the chassis 11A (near the power source 32) and is thereby pressed down and turned on; and when the fan assembly 10 is opened, the pressed fan switch 10A is released and turned off.

(1-10) Detailed Configuration of Fan Assembly

Figure 14:
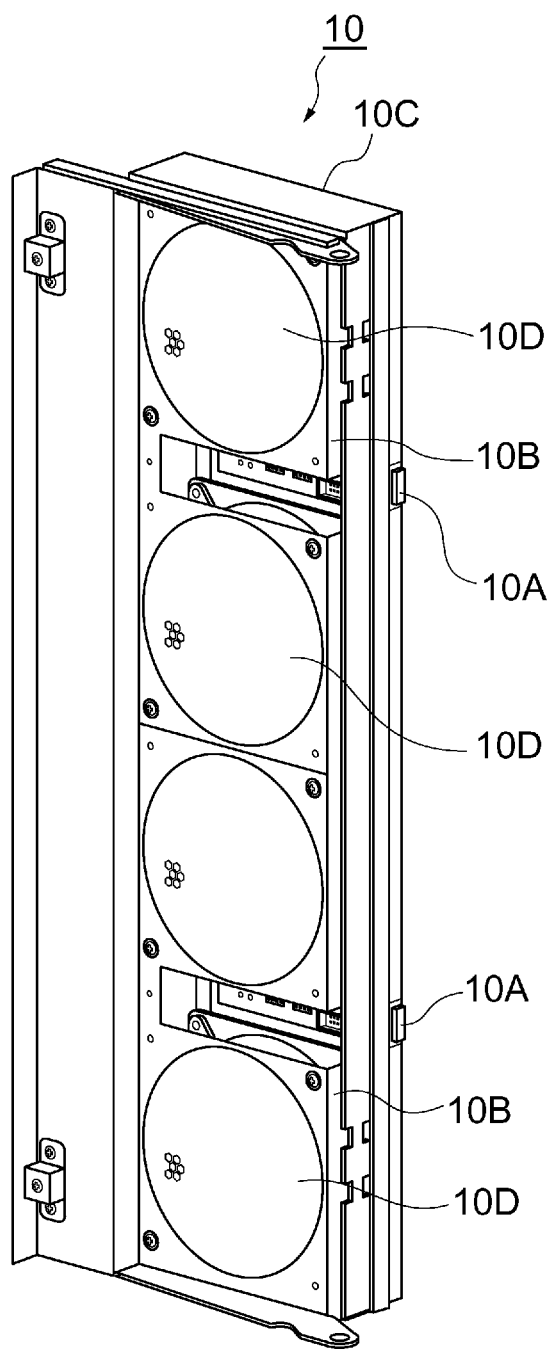
FIG. 14 is a perspective view showing an example of the external appearance of the fan assembly.

FIG. 14 shows an example of the external appearance of the fan assembly 10. The fan assembly 10 is of a long rectangular parallelepiped shape. The chassis 10C as described above is provided with two fan switches 10A at two positions on its side face. The chassis 100 includes two sets of fan units 10B, each set consisting of two fans covered with a cover 10D.

Figure 15:
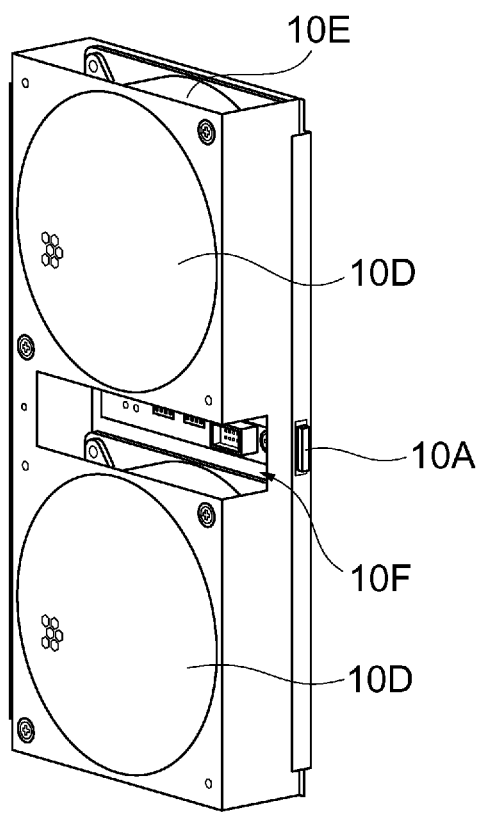
FIG. 15 is a perspective view showing an example of the external appearance of the fan unit.

FIG. 15 shows an example of the external appearance of one fan unit 10B. The fan unit 10B is of a substantially rectangular parallelepiped shape and two fans 10E are placed one on top of the other. When performing the maintenance work, each fan unit 10B can be attached or removed. A space area 10F exists between these two fans 10E.

Figure 16:
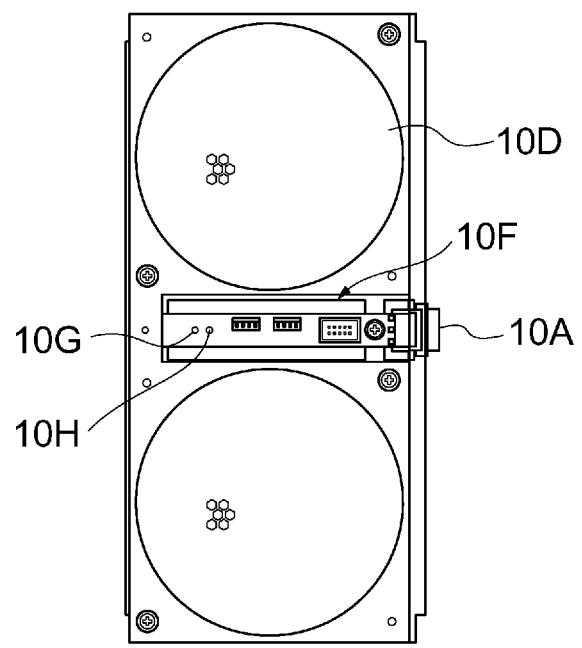
FIG. 16 is a front view of the fan unit.

FIG. 16 is a front view of a configuration example for the fan unit 10B. A temperature sensor 10G and a light-emitting diode (LED) 10H are placed in the space area 10F. The temperature sensor 10G is, for example, a thermistor and detects the temperature of the fan unit 10B. The LED 10H visually outputs specified matters such as the internal state and warnings. If the number of revolutions of the fan 10E is deficient, a specified warning is reported to the SVP (not shown). The temperature sensor 10G detects the temperature of each fan 10E. If any trouble occurs in a fan 10E, the remaining fans 10E are controlled to increase the output.

(2) Electrical Configuration

Figure 17:
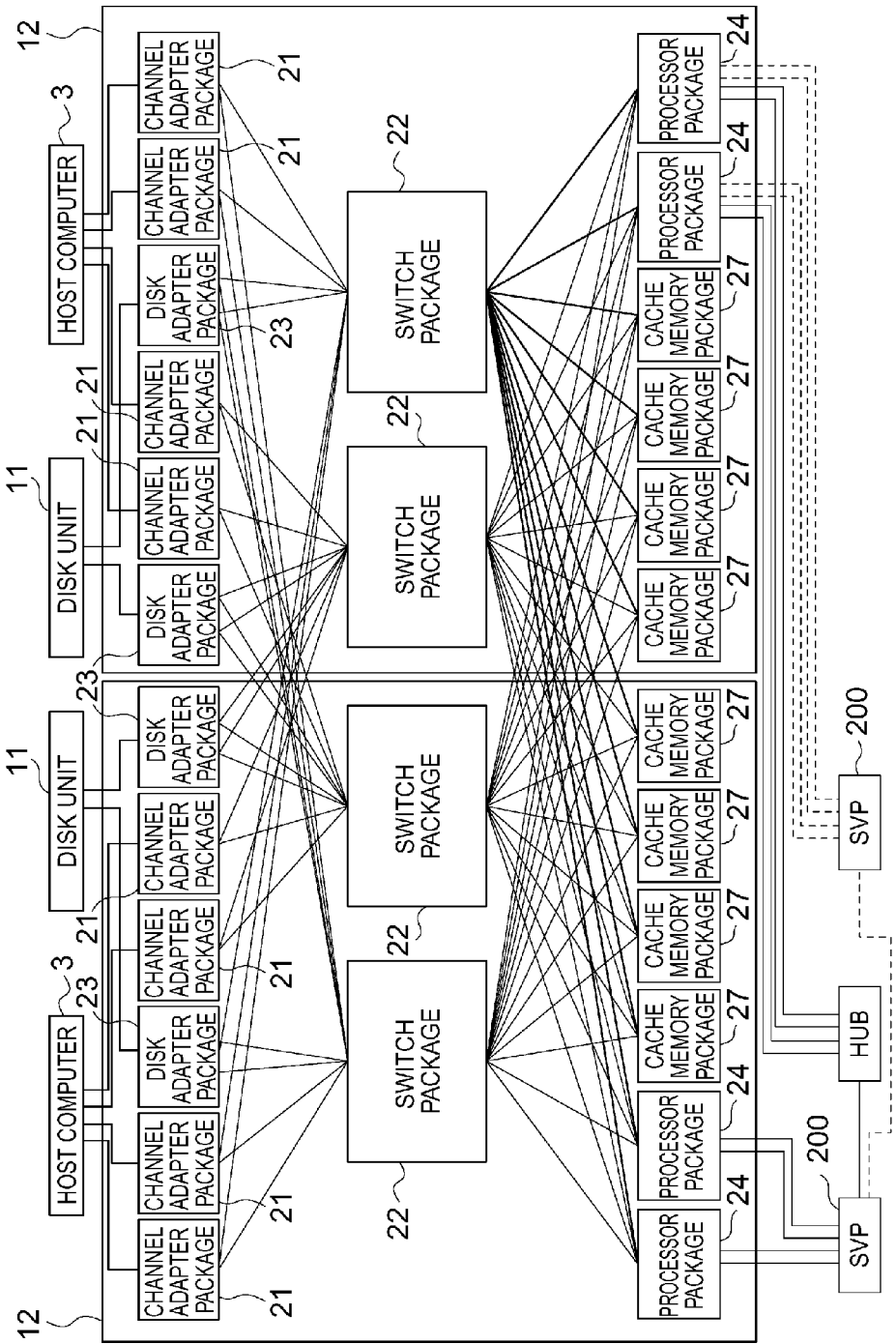
FIG. 17 shows an electric configuration example for the storage apparatus connected to host computers.

FIG. 17 shows an example of the electrical configuration of the storage apparatus 1 connected to the host computers 3. The storage apparatus 1 includes: the disk unit 11 for providing volumes for storing data to the host computers 3; and the disk controller 12 for controlling the disk unit 11. The disk unit 11 and the disk controller 12 are connected via a disk adapter package 23.

The disk unit 11 includes at least one hard disk drive 15 as a storage medium, a switch (SSW), and a drive circuit (not shown) for controlling driving of the hard disk drives 15. Incidentally, the hard disk drive 15 is abbreviated as HDD in the drawing.

The disk unit 11 is connected to the disk controller 12 via the switch. A plurality of disk units 11 can be connected in various forms by using a plurality of switches. Each switch includes an expander described later. A connection form in which the disk unit 11 is connected to the disk controller 12 is defined by a connection map.

The hard disk drives 15 mounted in the disk unit 11 constitute a RAID group according to a so-called RAID (Redundant Arrays of Inexpensive Disks) configuration and each hard disk drive 15 is accessed under the RAID control. The RAID group may extend across the plurality of disk units 11. The plurality of hard disk drives 15 belonging to the same RAID group is recognized as one virtual logical device by the host computer 3 as a host system.

The disk controller 12 is a system component for controlling the entire disk array system 1 and its main role is to execute input-output processing on the disk unit 11 in response to an access request from the host computer 3. This disk controller 12 executes processing relating to the management of the disk array system 1 in response to various requests from a service processor (SVP) (not shown).

The disk controller 12 includes channel adapter packages (CHA) 21, switch packages 22, disk adapter packages (DKA) 23, processor packages 24, and cache memory packages 27. Two pieces of each component contained in the disk controller 12 are duplicated from the viewpoint of fault tolerance, and the disk controller 12 can access the disk unit 11 by using two or more channels (connection paths).

The channel adapter package 21 is an interface for connection with the host computer 3 via a network and controls data communication with the host computer 3 according to specified protocol. For example, when receiving a write command from the host computer 3, the channel adapter package 21 writes the write command and the relevant data for the write command to each memory (not shown) via the switch and the cache memory 27. In other words, the channel adapter package 21 writes the data from the host computer 3 to the disk unit 11 via the cache memory 27. The channel adapter package 21 may sometimes be called a host interface or front-end interface.

The switch package 22 is an interface between the components in the disk controller 12 and controls data transmission and reception between the components.

The disk adapter package 23 is an interface for connection with the disk unit 11. The disk adapter package 23 transfers data to/from the disk unit 11 according to specified protocol in accordance with an I/O command from the host computer 3.

For example, when receiving a write command, the disk adapter package 23 accesses the disk unit 11 in order to destage data on the cache memory package 27, which is designated by the write command, to the disk unit 11 (that is, a specified storage area in the hard disk drive 15). When each controller for the disk adapter package 23 receives a read command, the disk adapter package 23 accesses the disk unit 11 in order to stage data on the disk unit 11, which is designated by the read command, to the cache memory package 27.

The disk adapter package 23 implements a failure recovery function in addition to the above-mentioned I/O function. These functions are implemented as, for example, firmware. The disk adapter package 23 may sometimes be called a disk interface or back-end interface The processor package 24 includes a processor. The processors control the operation of the entire disk array system 1 by executing various control programs and controlling the operation of the disk controller 12.

The service processor (hereinafter sometimes referred to as SVP) has a function managing the entire disk array system 1. A system administrator may give a command via the service processor to the disk controller 12, thereby making it possible to refer to system configuration information for the disk array system 1 or set or change this system configuration information. For example, along with the addition of the hard disk drive 15, the system administrator can set a logical volume and a virtual volume and set the RAID configuration via the service processor.

(3) Control Example for Fan Unit

Figure 18:
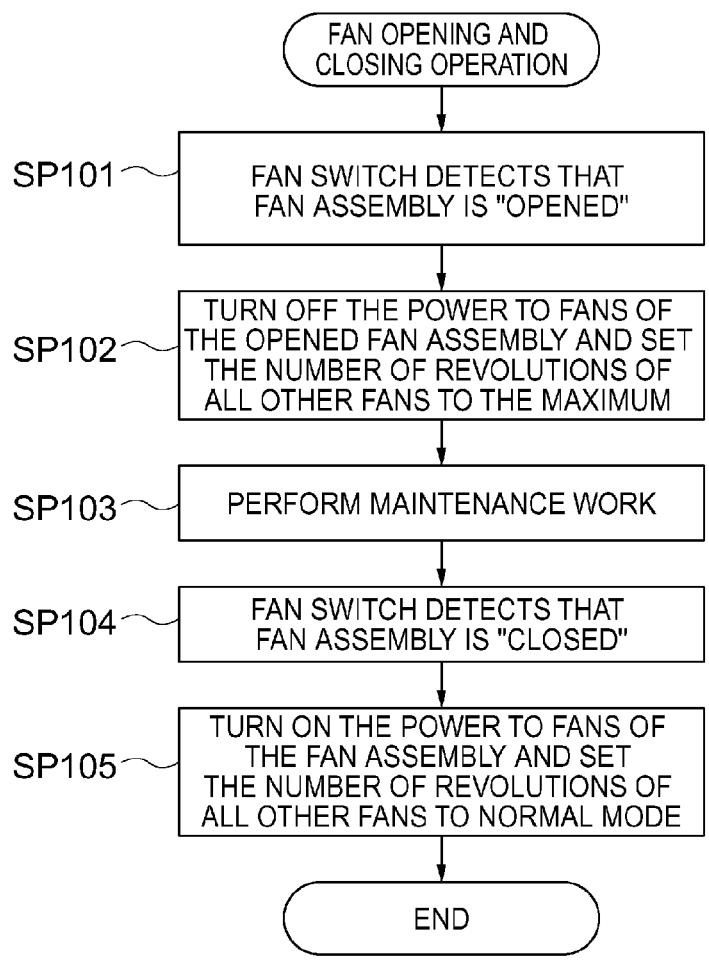
FIG. 18 is a flowchart illustrating an example of control when opening or closing the fan assembly.

FIG. 18 shows an example of control when opening or closing the fan assembly 10. When the fan assembly 10 is opened relative to the chassis 10A, the fan switch 10A is turned to the OFF state and a control unit (not shown) for the disk unit 11 detects according to a signal from the fan switch 10A that the fan assembly 10 is opened (SP101).

The control unit sets the power source for all the fans 10E for the opened fan assembly 10 to off and also sets the number of revolutions of all the fans 10E for the remaining fan assemblies 10 to, for example, the maximum (SP102). When the fan assemblies 10 enter this state, the maintenance work such as replacement of the hard disk 15 is performed (SP103).

When the maintenance work is completed and the opened fan assembly 10 is closed, the fan switch 10A enters the off state and the control unit receives that signal from the fan switch 10A (SP104). As triggered by reception of that signal, the control unit sets the power source for the fans 10E for the fan assembly 10 to on and also sets the number of revolutions of all the fans 10E for the remaining fan assemblies 10 to the normal number of revolutions (SP105).

Figure 19:
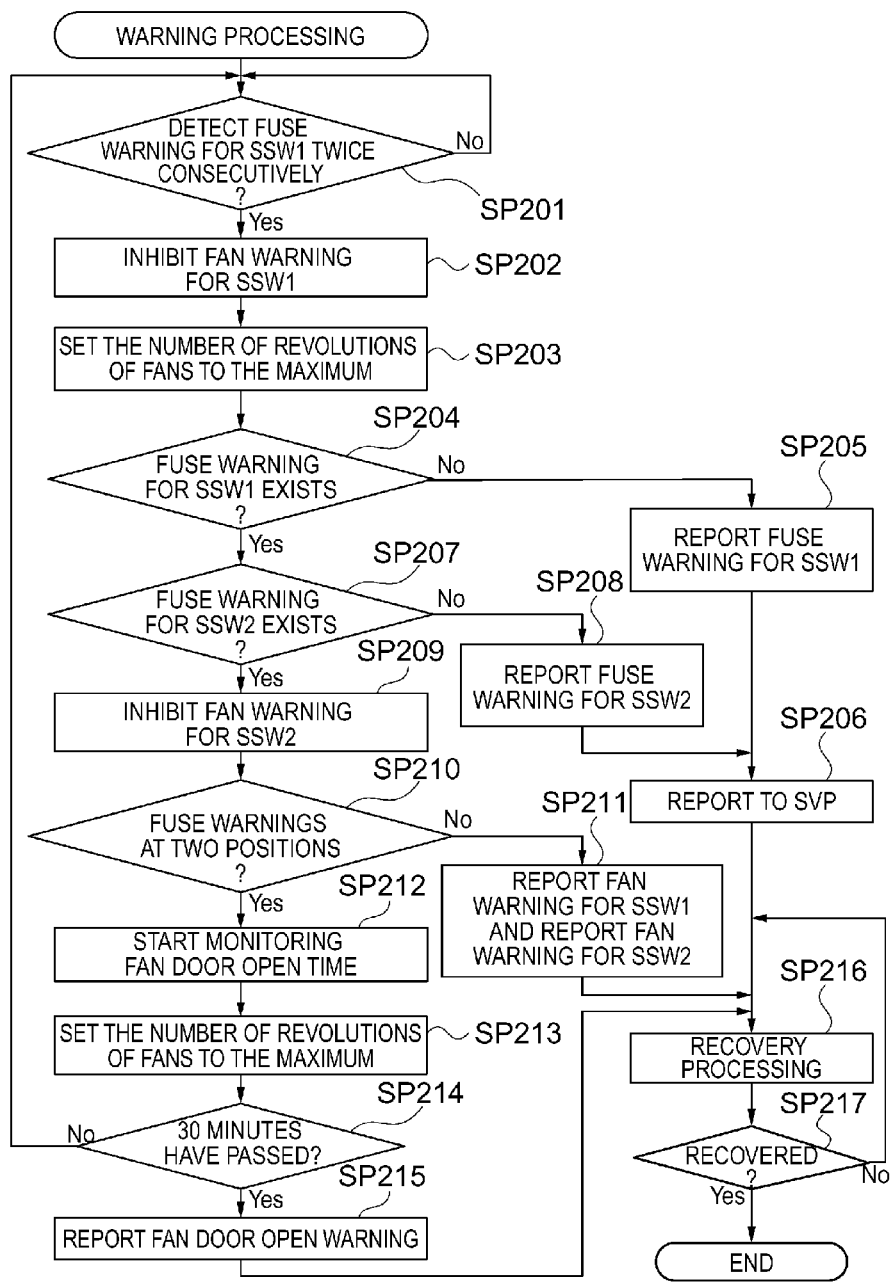
FIG. 19 is a flowchart illustrating an example of warning processing.

FIG. 19 shows an example of warning processing. Firstly, one fan assembly 10 is provided with two sets of fans 10E and each of the fans 10E corresponds to a separate power supply line (not shown in FIG. 19). Each power supply line is provided with a fuse (not shown in FIG. 19). An environment monitor (not shown) checks the state of each fuse, using, for example, the temperature sensor 10G. Incidentally, a fuse warning is a warning issued when the temperature of the fuse has increased to a specified temperature or higher and the fuse is in a high-temperature state.

Assuming that the system of the fan assemblies 10 is in the normal state at the beginning, if a fuse warning for SSW1 is detected twice consecutively (SP201), the control unit (not shown) for the disk unit 11 inhibits a fan warning for SSW1 which is output in response to the fuse warnings (SP202). Then, this control unit increases the output of all the remaining fans 10E in the fan assemblies 10 mounted on the target disk unit 11 by setting the output to, for example, the maximum (SP203).

This control unit checks if a fuse warning for SSW1 exists or not (SP204). If there is no fuse warning, this control unit recognizes that a failure has occurred in the fuse for SSW1; and reports the SSW1 fuse warning to the disk controller 12 (SP205) and also reports it to the SVP (not shown) (SP206). Next, recovery processing is executed (SP216, SP217); and then this warning processing terminates.

On the other hand, if the fuse warning exists in step SP204, the control unit checks if a fuse warning for SSW2 exists or not (SP207). If there is no fuse warning, the control unit recognizes that a failure has occurred in the switch 10A or the fan assembly 10; and reports the SSW2 fuse warning to the disk controller 12 (SP208) and also reports it to the SVP (not shown) (SP206). As a result, a command is issued to replace the relevant fan assembly 10. Subsequently, the recovery processing is executed (SP216, SP217) and then the warning processing terminates.

On the other hand, if the fuse warning exists in step SP207, the control unit inhibits a fan warning for SSW2 which is output in response to the fuse warning (SP209). Then, the control unit checks if the SSW2 fuse warning exists at two positions or not (SP210). If the fuse warning does not exist at two positions, the control unit reports the SSW1 fan warning to the disk controller 12 and reports the SSW2 fan warning to the disk controller 12 (SP211). Next, the recovery processing is executed (SP216, SP217), and then the warning processing terminates.

On the other hand, if the fuse warning exists at two positions in step SP210, the control unit determines that the fan assembly 10 is in an opened state; and starts monitoring open time of the fan assembly 10 (corresponding to a fan door in the drawing) (SP212). Next, the control unit increases the output of all the remaining fans 10E in the fan assemblies 10 mounted on the target disk unit 11 by setting the output to, for example, the maximum (SP213).

If 30 minutes or more have not passed (SP214), the control unit returns to step SPSP201; and if 30 minutes or more have passed (SP214), the control unit reports a warning indicating that the fan assembly 10 has been opened for more than the specified period of time, to the disk controller 12 (SP215). Next, the recovery processing is executed (SP216, SP217), and then the warning processing terminates. Incidentally, according to the present embodiment, as triggered by detection of closure of the fan assembly 10 by the switch 10A, the control unit for the disk unit 11 sets the remaining fan assemblies 10 to the normal output.

(4) RAID and Fan Configuration (4-1) 3D+1P

Figure 20:
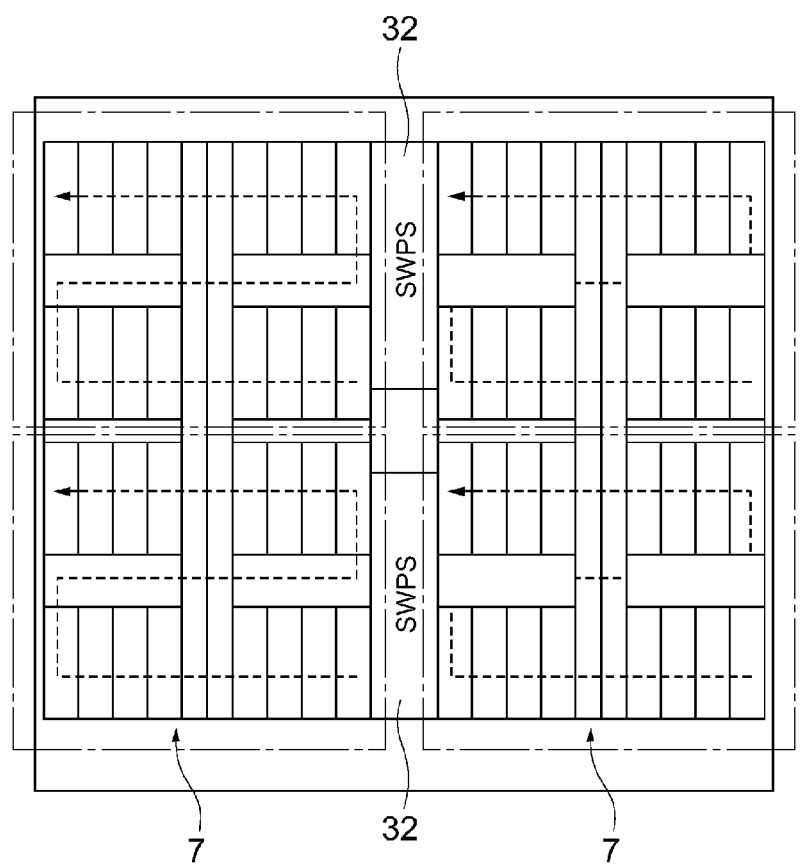
FIG. 20 is a plan view showing an example of the order of loading hard disk drives in the disk unit.

FIG. 20 shows an example of the order of mounting the hard disk drives 15 in the disk unit 11. The fan assemblies 10 are omitted in the drawing and the back face of the disk unit 11 is configured in the same manner. The order of mounting the hard disk drives 15 is to place one hard disk drive 15 at each of the following positions: at the right end of the bottom row in the right hard disk box 7 on the front face of the disk unit 11; at the right end of the bottom row of the left hard disk box 7 on the front face; at the right end of the bottom row in the right hard disk box 7 on the back face; at the right end of the bottom row of the left hard disk box 7 on the back face. This is a basic configuration in the present embodiment. After these four hard disk drives 15, the hard disk drives 15 are added one by one to the left of the already mounted hard disk drive(s) 15 according to the same rule.

In a fan assembly 10, each of the fan units 10B is in charge of cooling the upper part or lower part of the hard disk box 7 on a half portion of the front face or back face of the disk unit 11. If the above-described mounting order is used, a failure will not be caused in, for example, all the four hard disk drives 15 constituting one RAID group at the same time due to the influence from a failure in a fan 10E.

(4-2) Vertical Arrangement of 3D+1P

Figure 21:
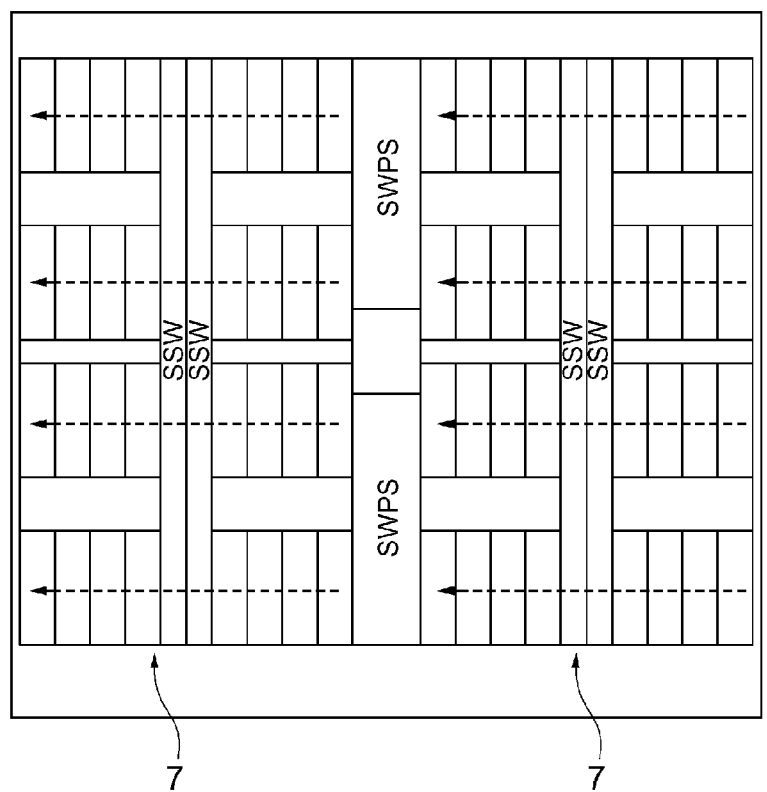
FIG. 21 is a plan view showing an example of the order of loading hard disk drives in the disk unit.

FIG. 21 shows another example of the order of mounting the hard disk drives 15 in the disk unit 11. The fan assemblies 10 are omitted in the drawing. The back face of the disk unit 11 has the same configuration as that shown in FIG. 21. The order of mounting the hard disk drives 15 is to place four hard disk drives (one group) at the right end, one on each horizontal row, from the top to the bottom of the right hard disk box 7 on the front face of the disk unit 11 and then place four hard disk drives (one group) at the right end, one on each horizontal row, from the top to the bottom of the right hard disk box 7 on the back face. Next, returning to the front face, four hard disks 15 are placed in a vertical row by placing one at the second position from the right end on each horizontal row. After the right half portion is filled with the hard disk drives 15, the hard disk drives 15 are mounted in the left half portion in the same manner.

In a fan assembly 10, each of the fan units 10B is in charge of cooling of either the upper part or lower part of the hard disk box 7 on one half portion of the front face or back face of the disk unit 11. If the above-described mounting order is used, the first fan assembly 10 is opened so that the maintenance of one group of the hard disk drives 15, such as replacement or addition, can be done. Therefore, the work efficiency is enhanced and it is possible to prevent mistakes during the work.

(5) RAID Group Configuration (5-1) First Example of Arrangement of Fans According to RAID Group If a RAID group consists of a plurality of hard disk drives 15 on the front face of the chassis 20 and a plurality of hard disk drives 15 on the back face of the chassis 20, the fan assemblies 10 are arranged according to the present embodiment as described below. Specifically speaking, each of a plurality of fans 10E for the fan assemblies 10 on the front face of an additional chassis is placed to face the plurality of hard disk drives 15 on the front face of the additional chassis. Also, each of a plurality of fans 10E for the fan assemblies 10 on the back face of the additional chassis is placed to face the plurality of hard disk drives 15 on the back face of the additional chassis.

(5-2) Second Example of Arrangement of Fans According to RAID Group

If a RAID group consists of a plurality of hard disk drives 15 arranged in the vertical direction of the disk unit 11 according to the present embodiment, the plurality of fans 10E of the front face fan assembly 10 may be arranged in the vertical direction, and the plurality of fans 10E the back face fan assembly 10 may be arranged in the vertical direction.

(5-3) Positional Relationship Between Hard Disk Drives and Fans

Figure 22:
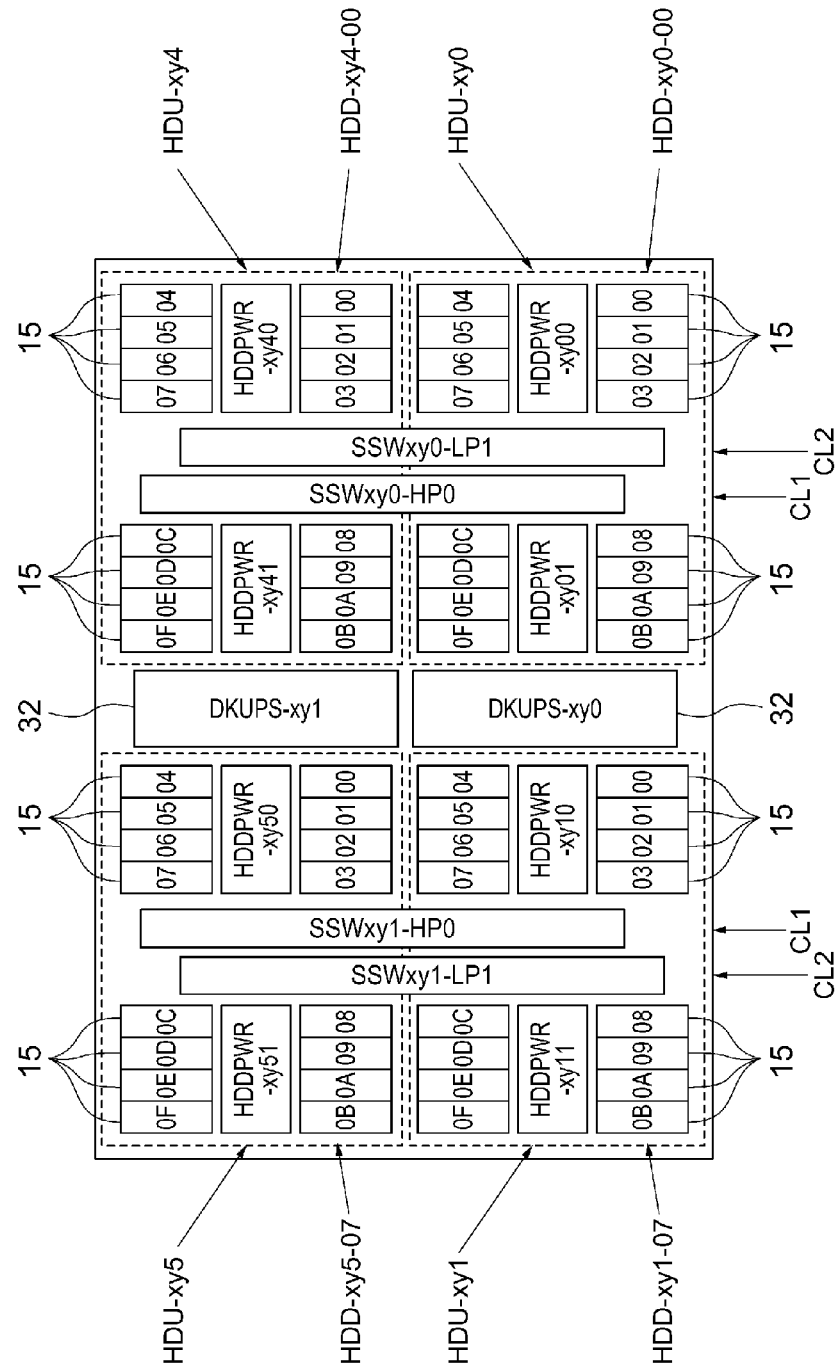
FIG. 22 is a plan view showing the positional correspondence relationship between hard disk drives and fans.
Figure 23:
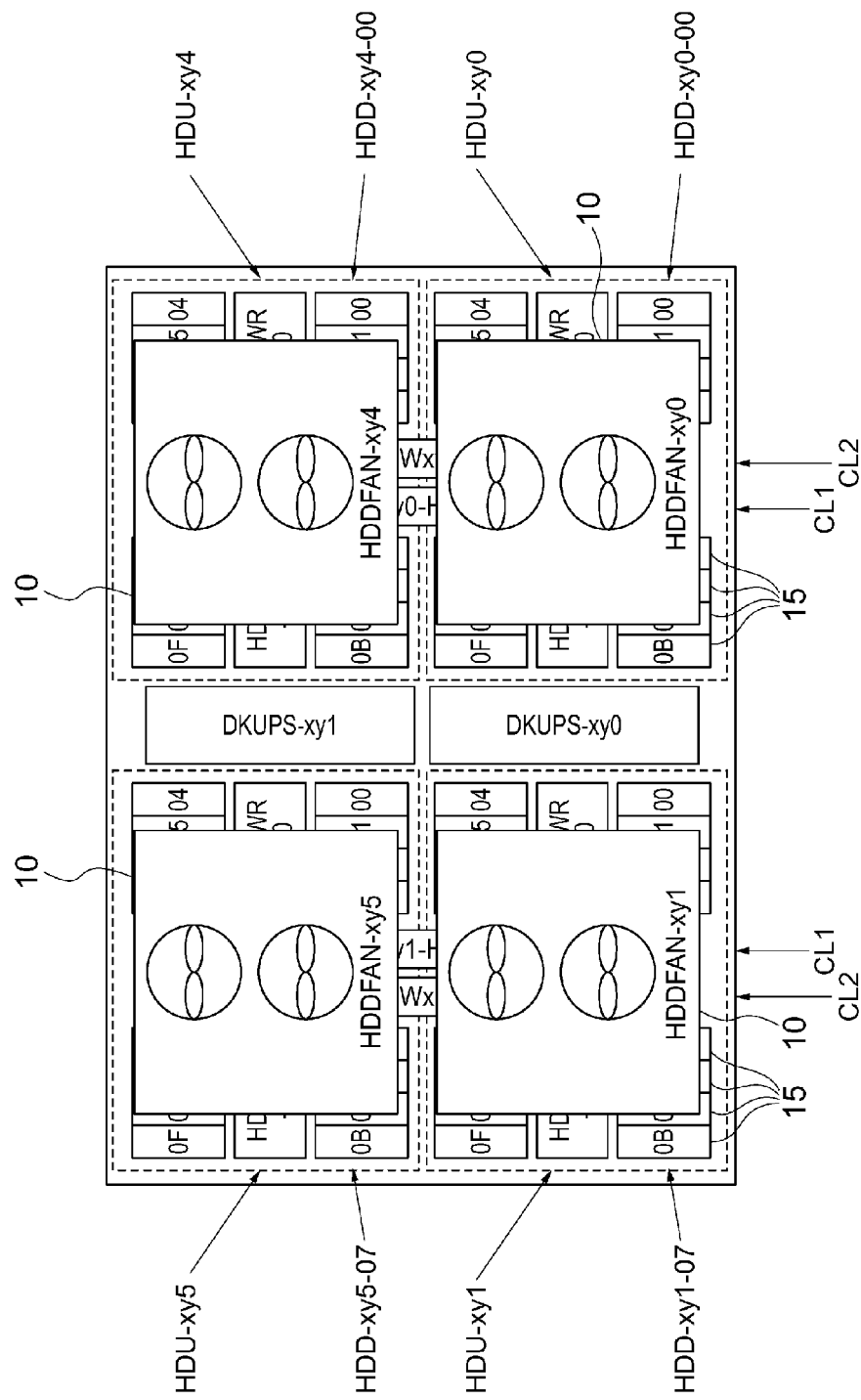
FIG. 23 is a plan view the positional correspondence relationship between the hard disk drives and the fans.
Figure 24:
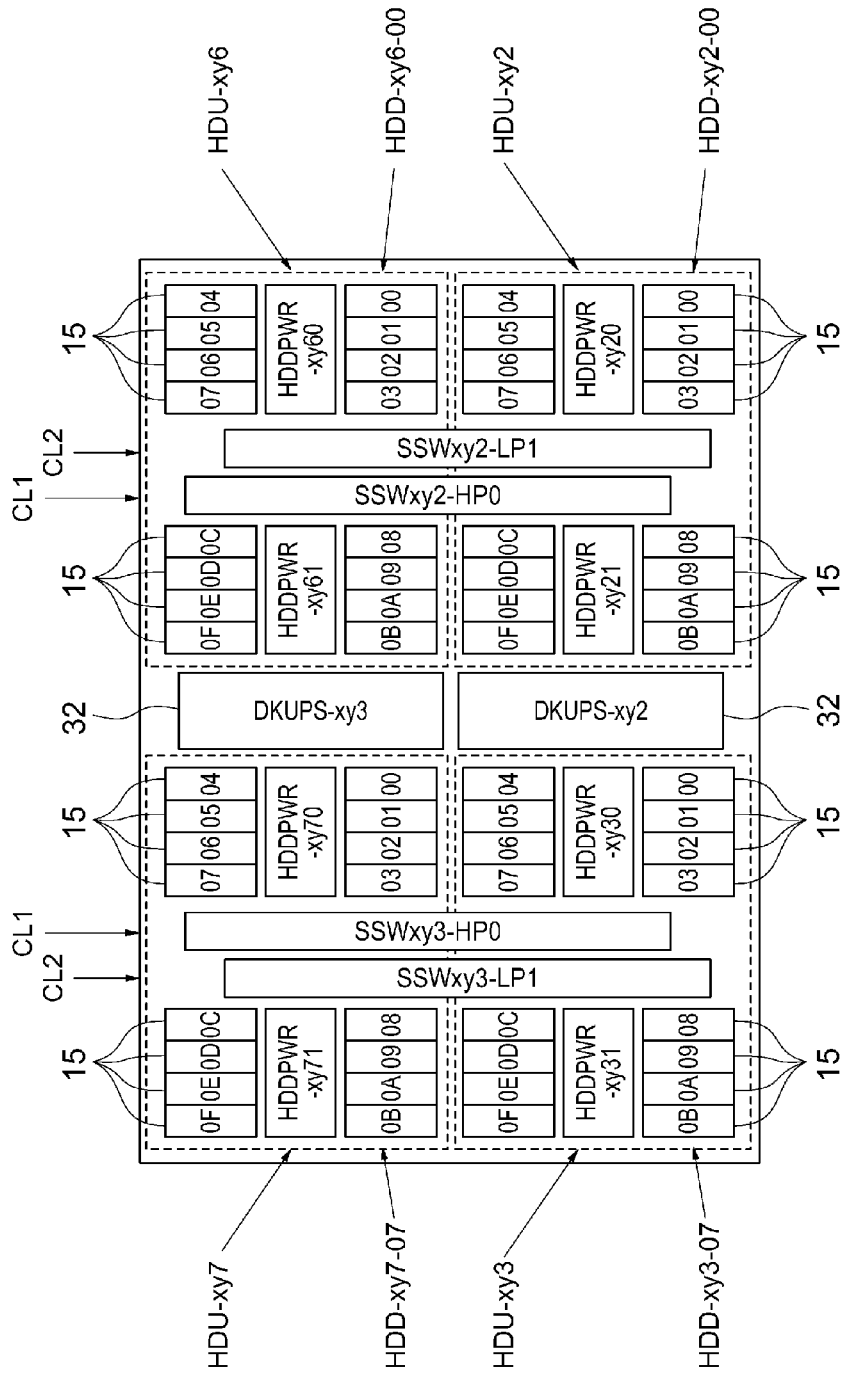
FIG. 24 is a plan view the positional correspondence relationship between the hard disk drives and the fans.
Figure 25:
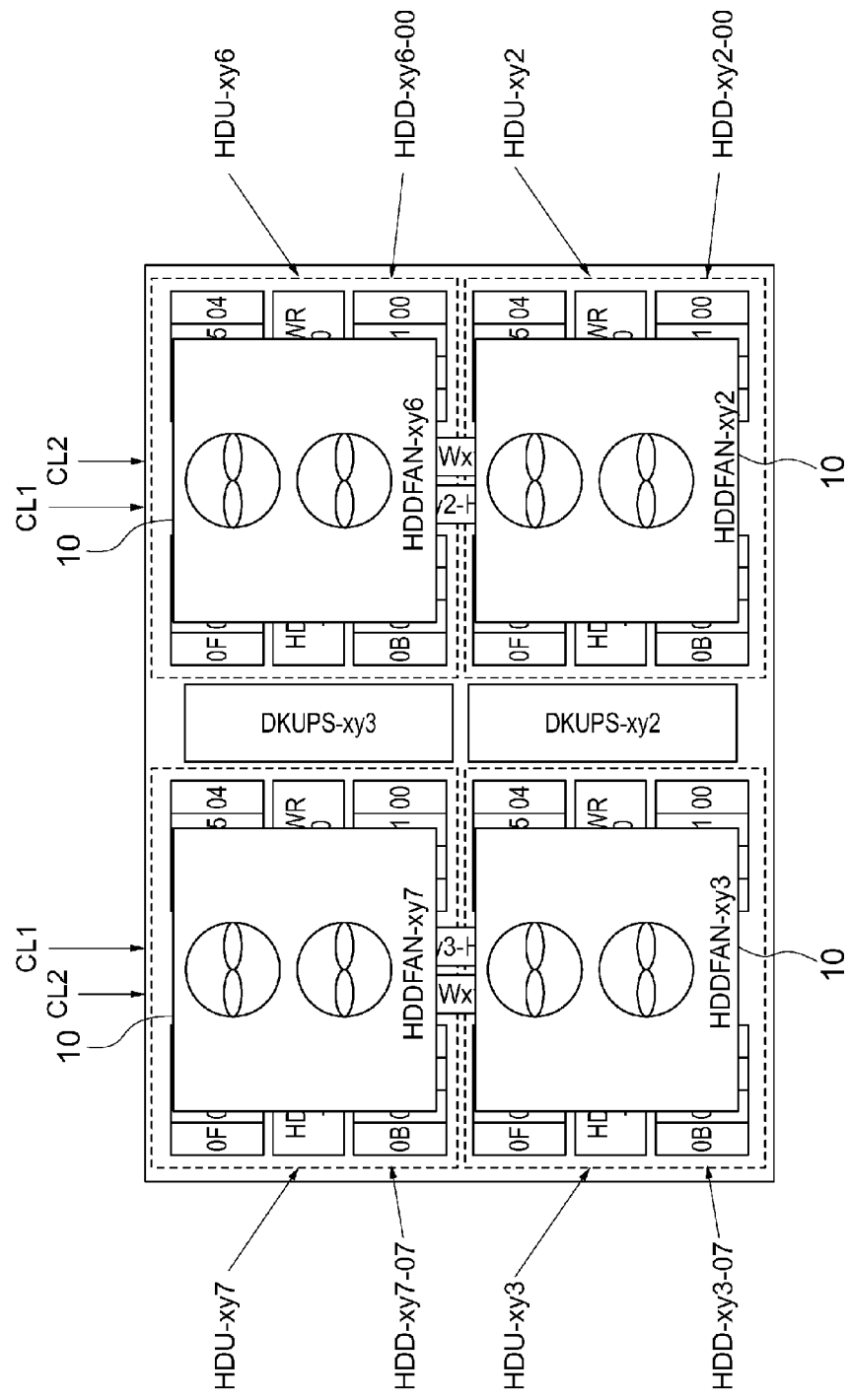
FIG. 25 is a plan view the positional correspondence relationship between the hard disk drives and the fans.

FIGS. 22 to 25 show the positional correspondence relationship between the hard disk drives 15 and the fans 10E. FIGS. 22 and 23 show the arrangement on the front face of the disk unit 11, while FIGS. 24 and 25 show the arrangement on the back face of the disk unit 11.

Each of FIGS. 22 and 24 shows the arrangement of the hard disk drives 15 and the power source 32 where the fan assemblies 10 are removed. Characters assigned to each hard disk drive 15 and to each power source 32 represent a hard disk address (corresponding to an HDD address described later) and a power source unit address, respectively. Each of FIGS. 23 and 25 shows the state where the fan assemblies 10 are placed over the hard disk drives 15. Incidentally, a character string assigned to each fan assembly 10 represents a fan address (corresponding to a FAN address described later) of the relevant fan assembly 10.

FIG. 26 is a chart showing an example of the arrangement shown in FIGS. 22 to 25. Each hard disk box 7 described earlier is assigned an address to distinguish from other hard disk boxes 7 (HDDBOX address). This chart shows the HDD address and the FAN address corresponding to the HDDBOX address of each hard disk box 7.

(6) Lock Mechanism for Fan Assembly

The storage apparatus 1 in the present embodiment has the following regulating member as one of its characteristics. Specifically speaking, this regulating member is a mechanism for regulating, according to the open-close state of at least one fan assembly 10 from among the plurality of fan assemblies 10 on the front face of the chassis 20 and the plurality of fan assemblies 10 on the back face of the chassis 20, the open-close state of the remaining fan assemblies 10. As an example of this regulating member, a lock mechanism and an open-close regulating member will be explained below.

Figure 27:
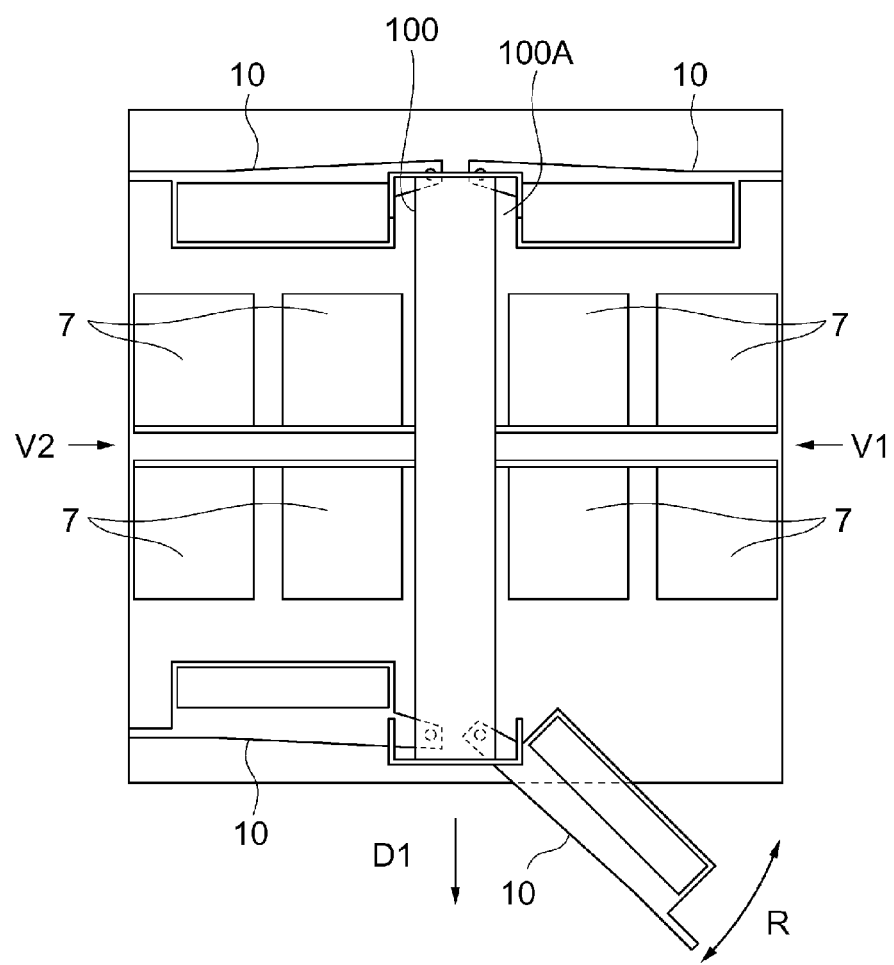
FIG. 27 is a plan view showing a configuration example for a lock mechanism for the fan assemblies.
Figure 28:
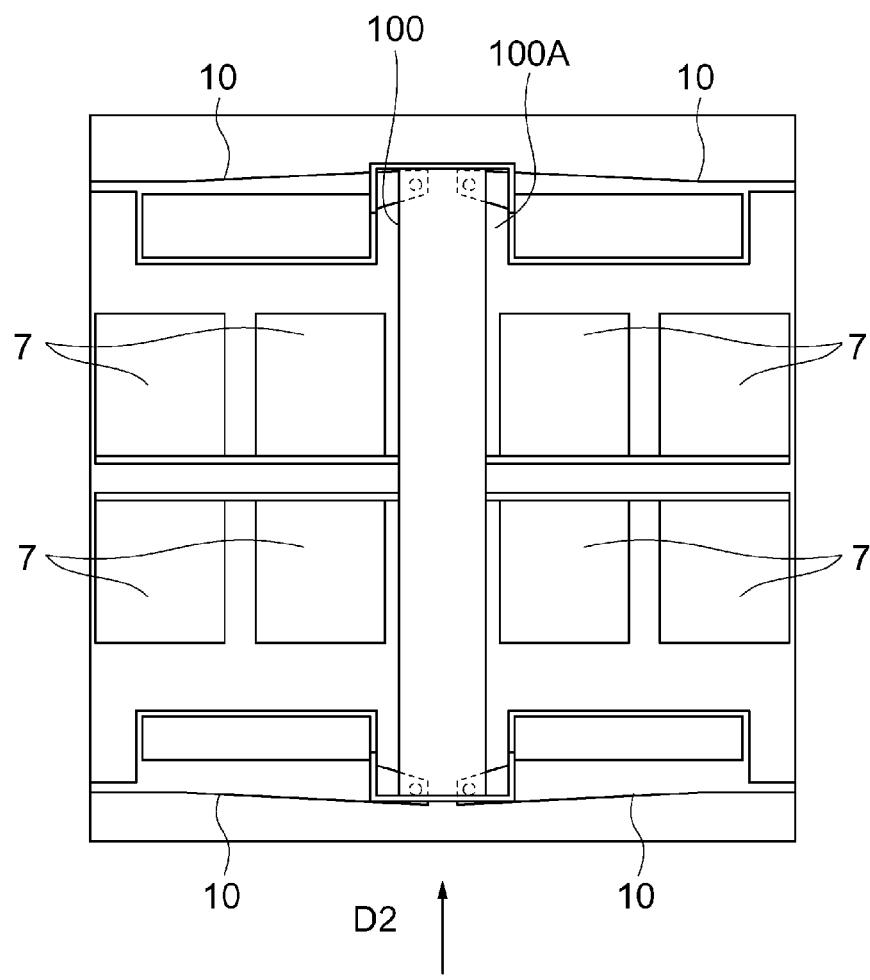
FIG. 28 is a plan view showing a configuration example for the lock mechanism for the fan assemblies.

Each of FIGS. 27 and 28 shows a configuration example for a lock mechanism 100 for the fan assemblies 10. FIG. 27 shows the state where the locked state is released by the lock mechanism 100, and FIG. 28 shows the locked state where the fan assemblies 10 are locked by the lock mechanism 100.

As a lock member 100A for the lock mechanism 100 is moved toward a D1 direction as shown in FIG. 27, the lock mechanism 100 releases the regulated state in which the front fan assemblies 10 are regulated so that they will not open. Consequently, the front fan assembly 10 can be opened or closed in R directions. On the other hand, if the lock member 100A is moved toward a D2 direction as shown in FIG. 28, the lock mechanism 100 regulates an opening of the front fan assemblies 10 so that all of the front fan assemblies 10 are fixed.

Figure 29:
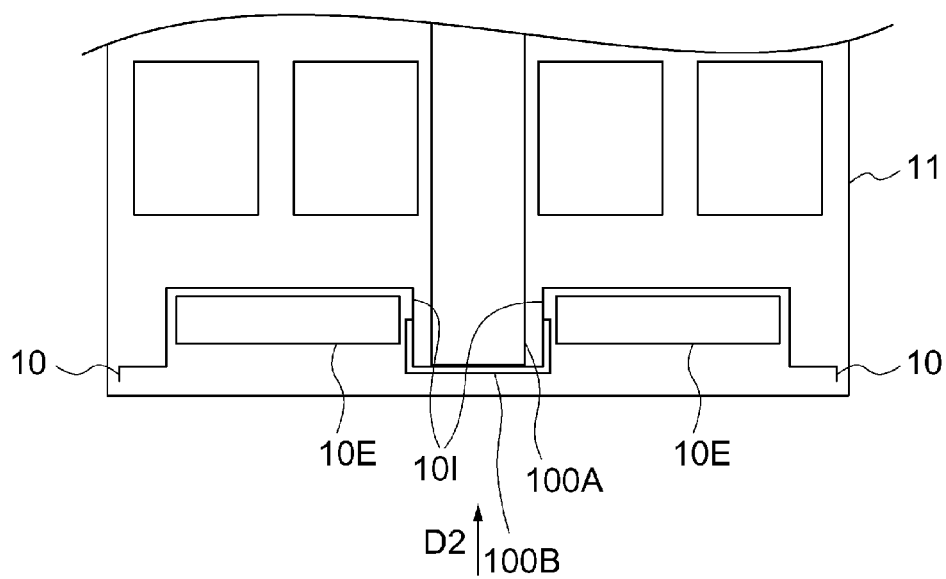
FIG. 29 is a plan view showing an operation example for the lock mechanism.
Figure 30:
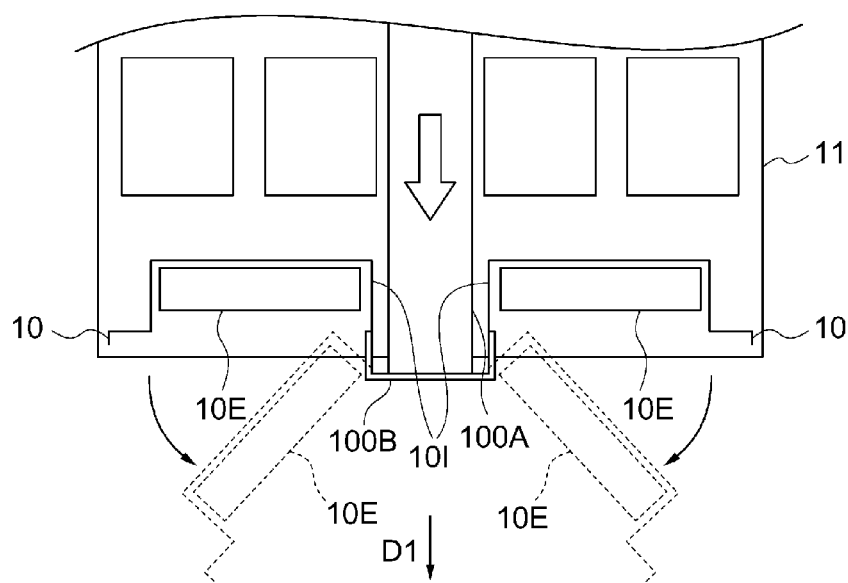
FIG. 30 is a plan view showing an operation example for the lock mechanism.

Each of FIG. 29 30 is a plan view showing an operation example for the lock mechanism 100. When the lock member 100A is moved toward the D2 direction to make the fan assemblies 10 enter the locked state as shown in FIG. 29, for example, the ends of a U-shaped fixing member 100B engage with inside walls 101 of the fan assemblies 10, so that the fixing member 100B secures the fan assemblies 10. On the other hand, when the engaged fixing member 100B is moved toward the D1 direction, it releases the inside walls 101 of the fan assemblies 10 to make them enter the unlocked state, thereby enabling the fan assembly 10 to be opened. Regarding the two sets of fan assemblies 10, only those on the front face side enter the opened state or the locked state, or those on the back face side enter the opened state or the locked state. The lock mechanism 100 is configured as described below when seen from a different direction.

Figure 31:
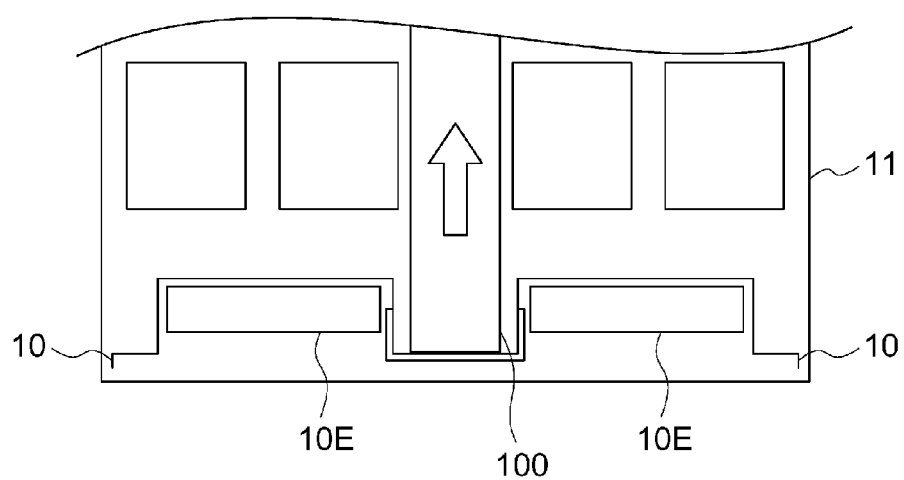
FIG. 31 is a plan view showing an operation example for the lock mechanism.
Figure 32:
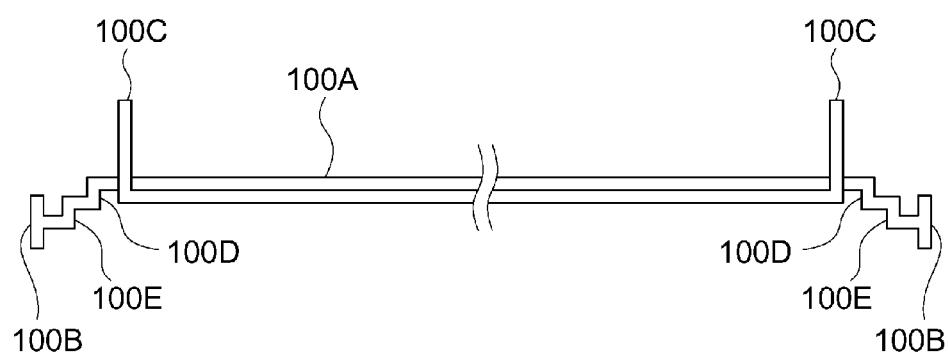
FIG. 32 is a side view showing a configuration example for the lock mechanism.
Figure 33:
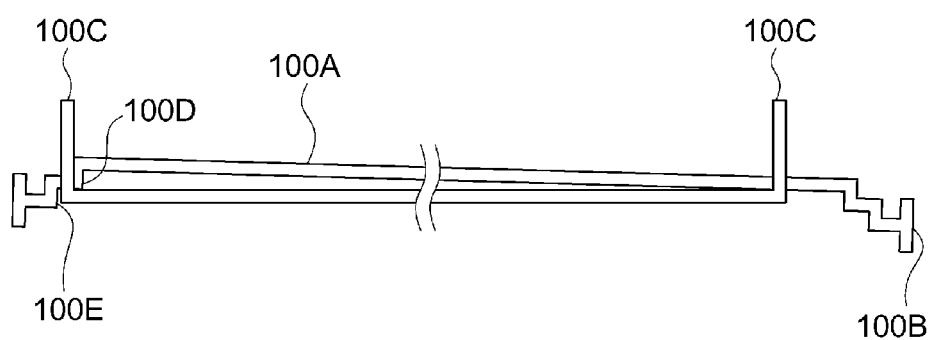
FIG. 33 is a side view showing a configuration example for the lock mechanism.
Figure 34:
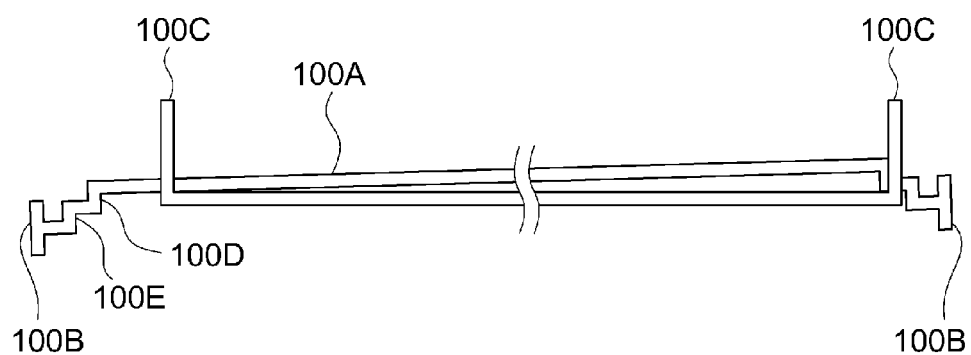
FIG. 34 is a side view showing a configuration example for the lock mechanism.

Each of FIGS. 32 to 34 shows a side view of a configuration example for the lock mechanism 100. FIG. 32 shows the locked state described above and corresponds to the state shown in FIG. 29. FIG. 33 shows the unlocked state of the front fan assemblies 10 and corresponds to the state shown in FIG. 30. FIG. 34 shows the unlocked state of the rear fan assemblies 10 and corresponds to FIG. 31.

The lock member 100A is a long flat-plate-like member as shown in FIG. 32 and each of its both ends is very slightly bent so as to form two-level steps 100D, 100E. Even if the lock member 100A slightly slides on a support member 100C while it is in the locked state as shown in FIG. 32, the step 100D hits and stops at the support member 100C so that the locked state of the fan assemblies 10 will not be released.

The step 100E makes the lock member 100A be moved a specified distance and hit at the support member 100C so that the position of the lock member 100A is fixed, when the front fan assemblies 10 are in the opened state as shown in FIG. 33.

The step 100E makes the lock member 100A be moved a curtain distance and hit at the support member 100C so that the position of the lock member 100A will be fixed, when the rear fan assemblies 10 are in the opened state as shown in FIG. 34.

(7) Simultaneous Open-Close Prevention Mechanism for Plurality of Fan Assemblies on Front Face Side or Back Face Side The storage apparatus 1 according to the present embodiment may include, as one of its characteristics, a lock mechanism for regulating the open operation of the plurality of fan assemblies 10 on the front face side and permitting the open operation of the plurality of fan assemblies 10 on the back face side, or for permitting the open operation of the plurality of fan assemblies 10 on the front face side and regulating the open operation of the plurality of fan assemblies 10 on the back face side. The lock mechanism will be specifically explained below.

Figure 35:
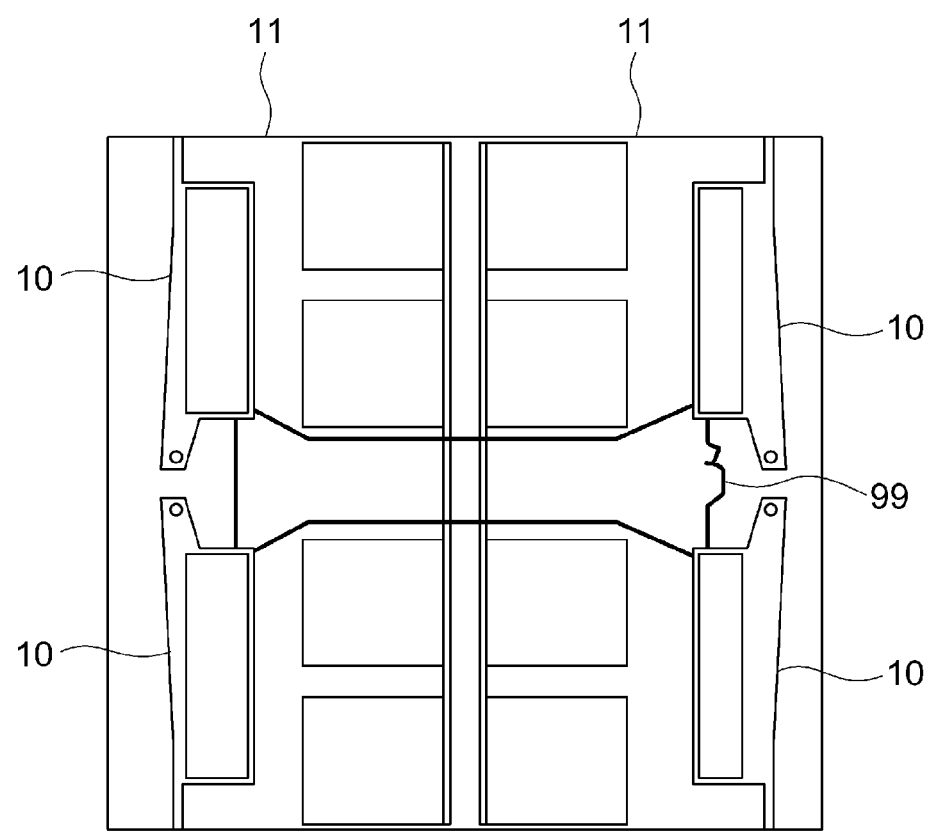
FIG. 35 is a plan view showing a configuration example for a simultaneous open-close prevention mechanism for the fan assemblies.
Figure 36:
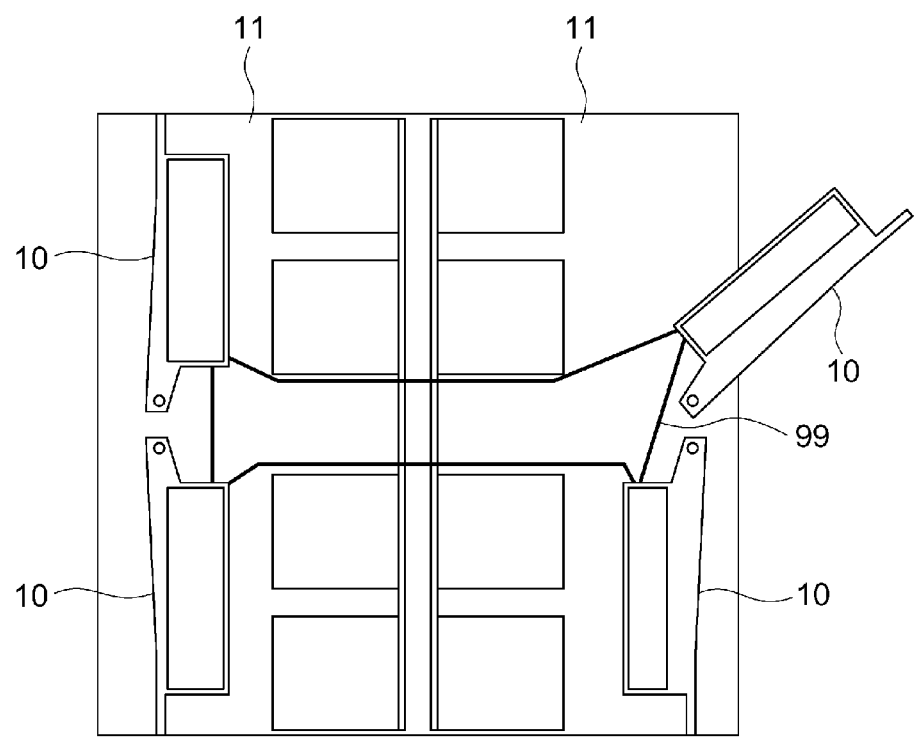
FIG. 36 is a plan view showing a configuration example for the simultaneous open-close prevention mechanism for the fan assemblies.

Each of FIG. 35 and FIG. 36 shows a configuration example for the simultaneous open-close prevention mechanism 99 for the fan assemblies 10. FIG. 35 shows the state where the fan assemblies 10 are closed, and FIG. 36 shows the state where one fan assembly 10 is opened.

The simultaneous open-close prevention mechanism 99 is provided so as to extend across the front fan assemblies 10 and the rear fan assemblies 10 as shown in FIG. 35. The simultaneous open-close prevention mechanism 99 is configured so that it retains some extra portion 99A, while it links and connects the four fan assemblies 10 together. This simultaneous open-close prevention mechanism 99 is composed of a rope-like member that is not almost expandable.

When one fan assembly 10 is opened as shown in FIG. 36, the simultaneous open-close prevention mechanism 99 is stretched to the full length, thereby keeping the other fan assemblies 10 forced to be closed. If such a configuration is used, it is possible to allow only one fan assembly 10 to be opened at once, thereby preventing shortage of the cooling air to be supplied to the hard disk drives 15 due to opening of the plurality of fan assemblies 10 at the same time.

(8) Configuration of One Module (8-1-1) Configuration of Module

Figure 37:
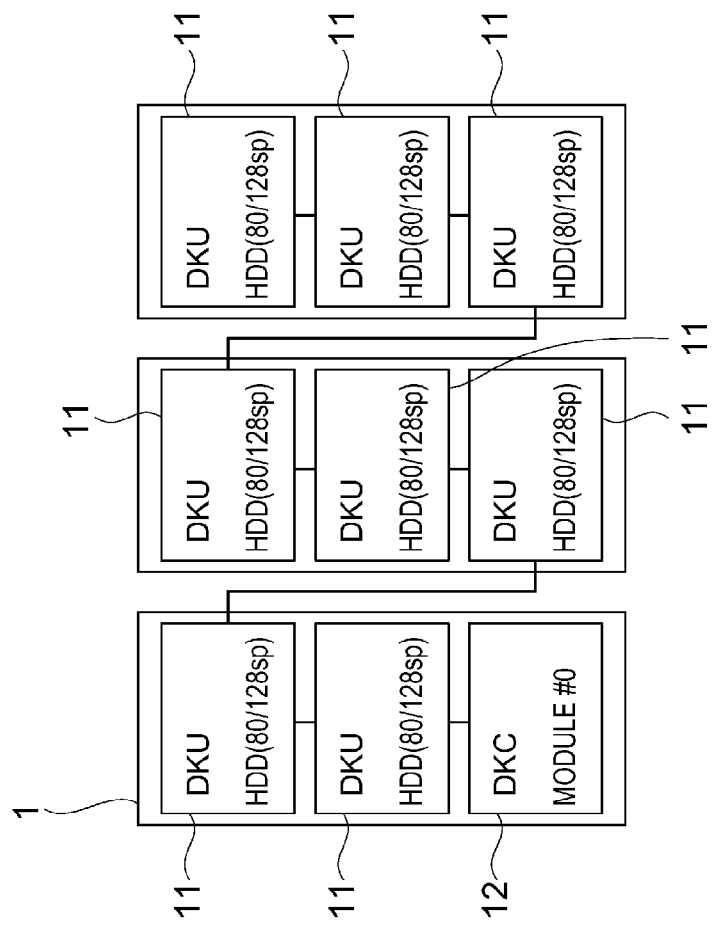
FIG. 37 is a block diagram showing a configuration example for the storage apparatus.

FIG. 37 shows a configuration example for the storage apparatus 1. A module herein means the disk unit 11 and the disk controller 12 constituting the storage apparatus 1. Various other module configurations can be used according to the present embodiment, and FIG. 37 shows that two sets of disk units 11 (each set consisting of three disk units 11) are added to the storage apparatus 1 shown on the left side.

(8-2-2) Connection Configuration Between Two Module Chassis

Figure 38:
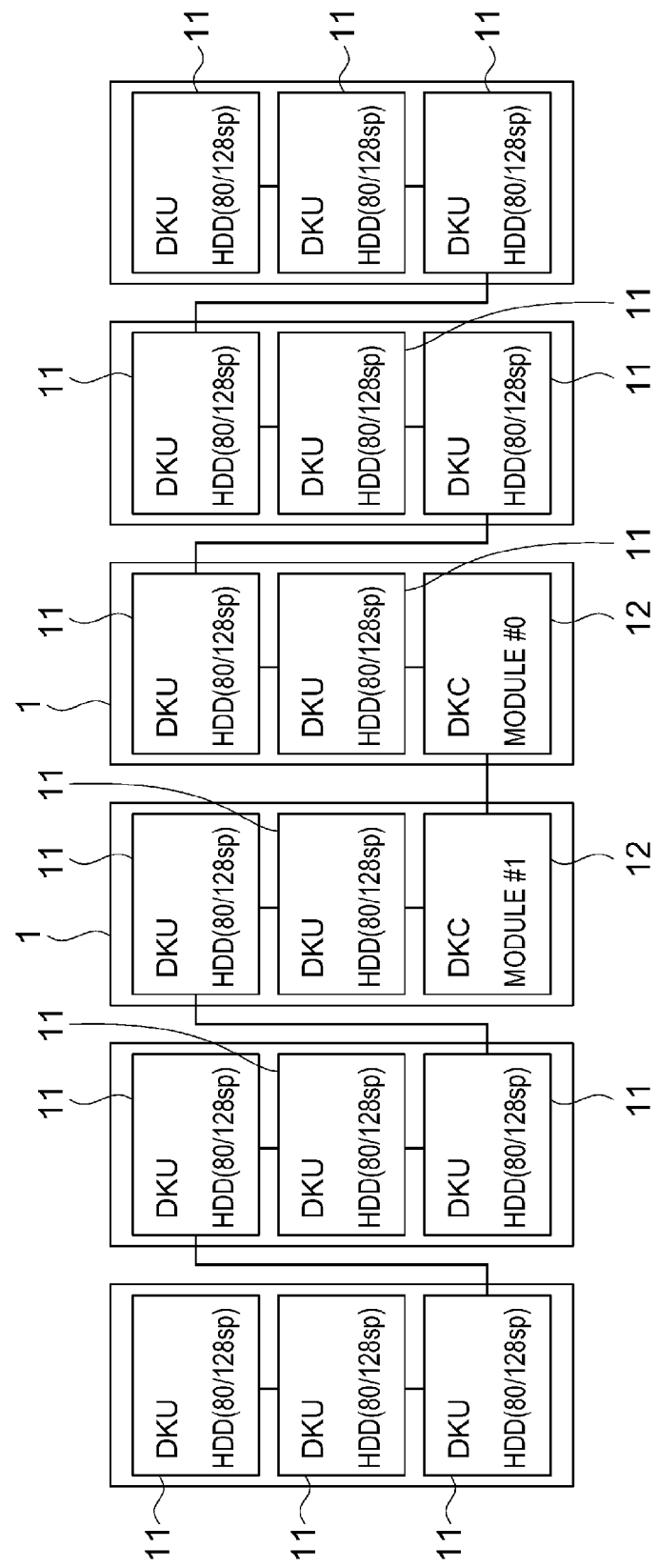
FIG. 38 is a block diagram showing a configuration example for the storage apparatus.

FIG. 38 shows a configuration example of the storage apparatus 1 connecting two modules. In the example shown in FIG. 38, two sets of disk units (each set consisting of three disk units 11) are added to the storage apparatus 1 in the same manner as shown in FIG. 37 to constitute one configuration, and the same two configurations are connected to each other via the disk controllers 12 for the respective configurations. Incidentally, the coupling disk controllers 12 are connected to each other with cables via a switch package described later (also, referred to as the inter-chassis coupling).

Figure 39:
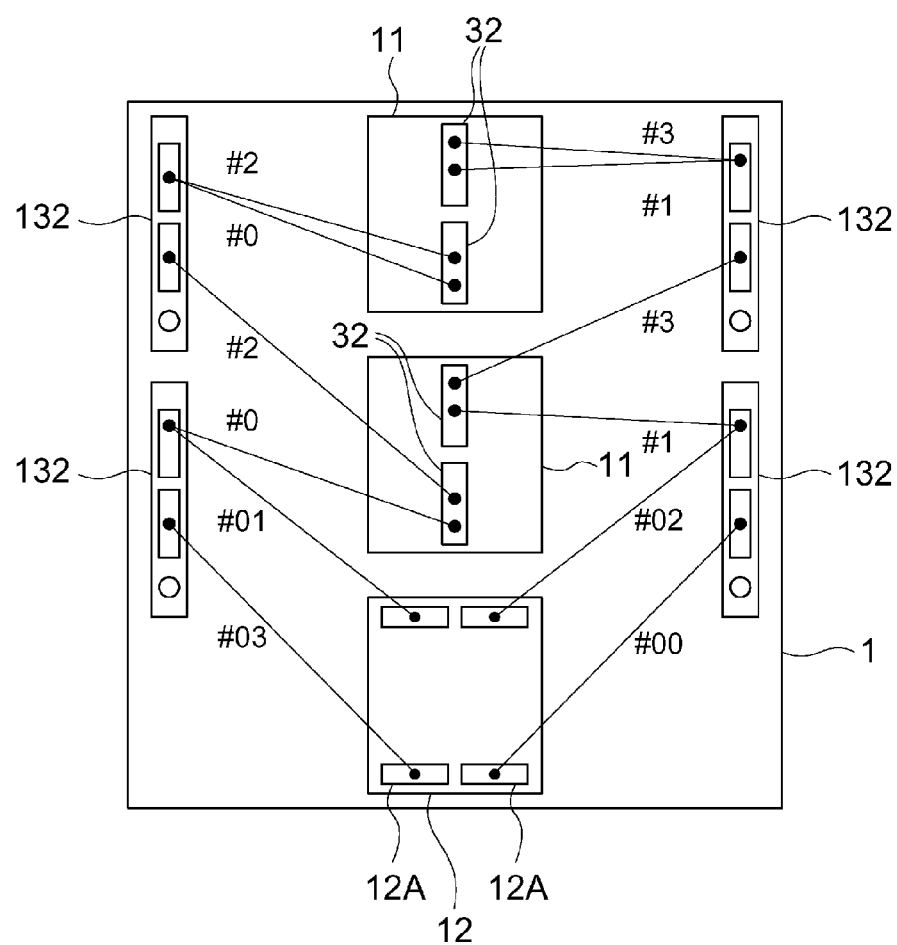
FIG. 39 is a conceptual diagram showing an example of the connection configuration of the power sources.
Figure 40:
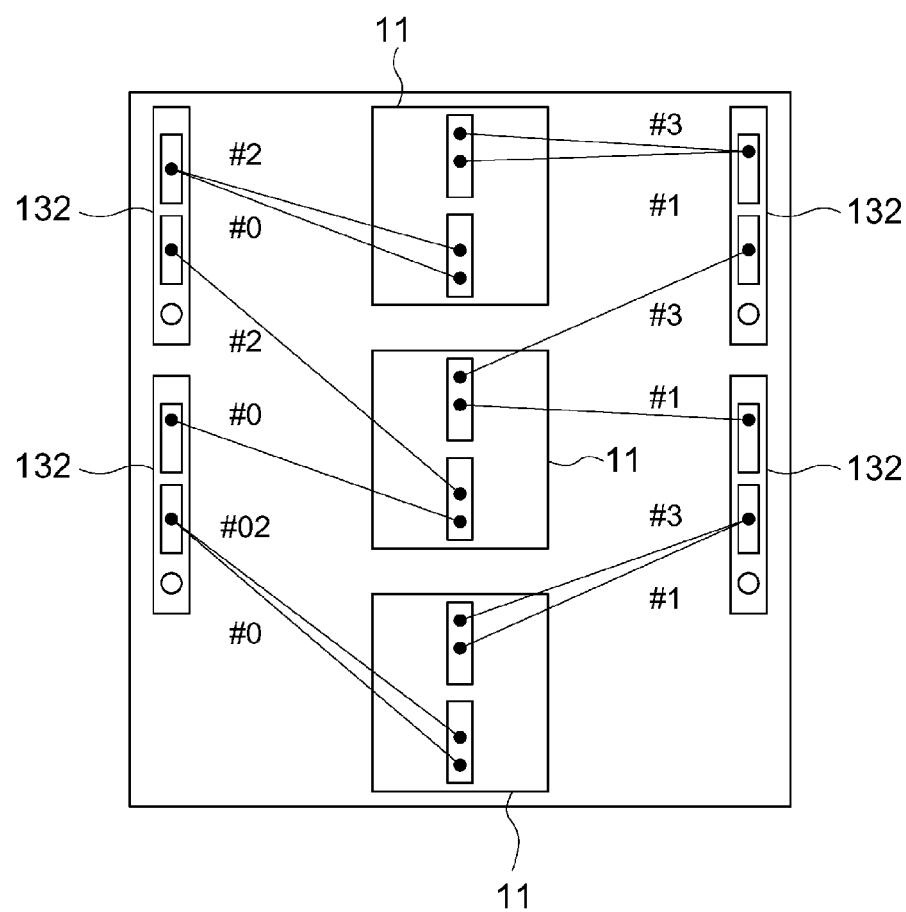
FIG. 40 is a conceptual diagram showing an example of the connection configuration of the power sources.

(9) Connection Configuration Relating to Power Sources (9-1) Connection Configuration Each of FIGS. 39 and 40 shows an example of the connection configuration of the power sources 32. FIG. 39 shows the connection configuration of the power sources in the configuration where the disk controller 12 and the two disk units 11 are connected, in the module configurations shown in FIG. 37 and FIG. 38. In the disk unit 11, the power sources 32 receive power supply from power sources 132 (which are also referred to as PDU). In the disk controller 12, power sources 12A also receive power supply from the power sources 132.

On the other hand, FIG. 40 shows the connection configuration of power sources in the configuration where three disk units 11 are connected, in the module configurations shown in FIG. 37 and FIG. 38. In the three disk units 11, the power sources 32 receive power supply from the power sources 132.

(9-2) Power Supply Configuration (9-2-1) Disk Controller

Figure 41:
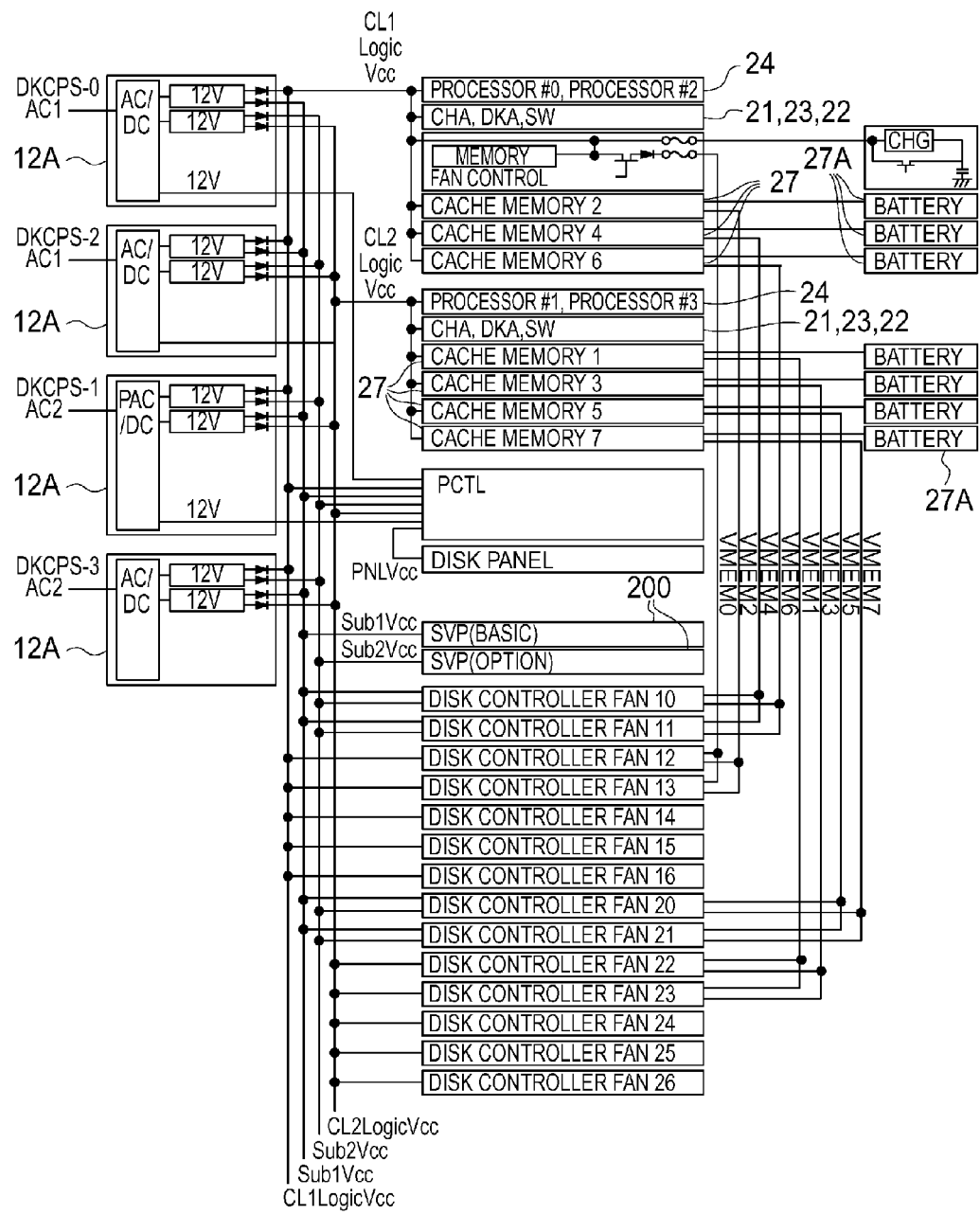
FIG. 41 is a connection diagram showing an example of the connection configuration of power sources in the disk controller.

FIG. 41 shows a connection configuration example for the power sources 12A in the disk controller 12. In the disk controller 12, for example, four power sources 12A supply, for example, 12V electric power to each component such as processors for the processor packages 24, the channel adapter modules 21, the switch packages 22, and the disk adapters 23. The cache memories 27 receive the electric power supplied from the above-described power sources 12A and also from batteries 27A.

(9-2-2) Disk Unit

Figure 42:
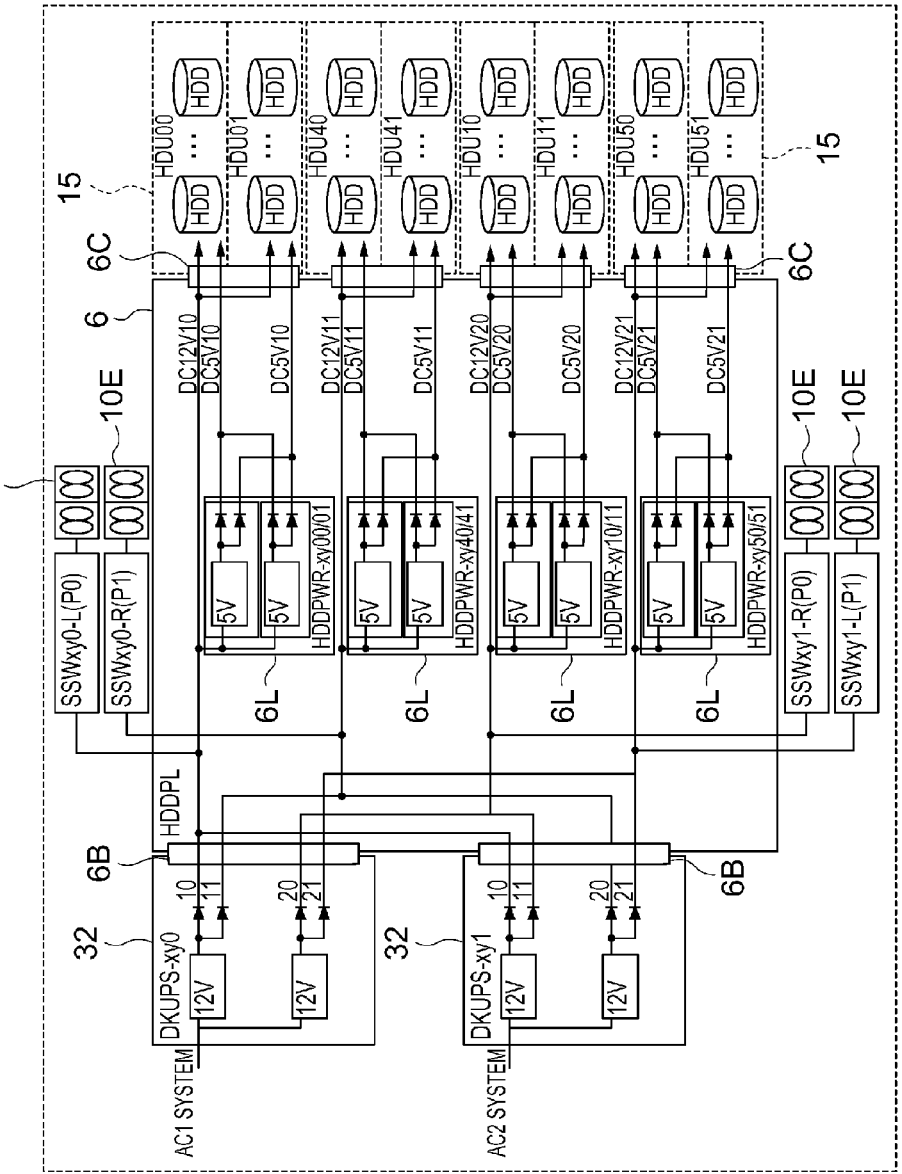
FIG. 42 is a connection diagram showing an example of the connection configuration of power sources in the disk unit.

FIG. 42 shows a connection configuration example for the power sources 32 in the disk unit 11. Two systems of power sources 32 such as an AC1 system and an AC2 system exist in the disk unit 11. The power sources 32 are mounted on the connectors 6B on the back board 6 as described earlier. In addition to these power sources 32, this back board 6 is provided with, for example, four power sources 6L for the hard disk drives and a plurality of SATA connectors 6C. The hard disk drive power sources 6L supply, for example, 5 V electric power to the hard disk drives 15. Incidentally, a character string assigned to each hard disk drive power source 6L as shown in the drawing represents an address for identify each hard disk drive power source 6L from among the plurality of power sources 6L (hard disk drive power source address). Each of the plurality of SATA connectors 6C is connected to the plurality of hard disk drives 15 described above.

The power sources 32 distributes the electric power on the back board 6 and supplies the electric power not only to the hard disk drives 15 (corresponding to the HDDs in the drawing), but also to the fan assemblies 10. Specifically speaking, the AC1 system power source 32 supplies the electric power to the four fans 10E mounted on the two fan assemblies 10. The AC1 system power source supplies the electric power through the above-described power source 32 to the hard disk drives 15. On the other hand, the AC2 system power source 32 supplies the electric power to the four fans 10E mounted on the two fan assemblies 10. Also, the AC2 system power source supplies the electric power through the above-described power source 32 to the hard disk drives 15.

(9-3) Connection Configuration

Figure 43:
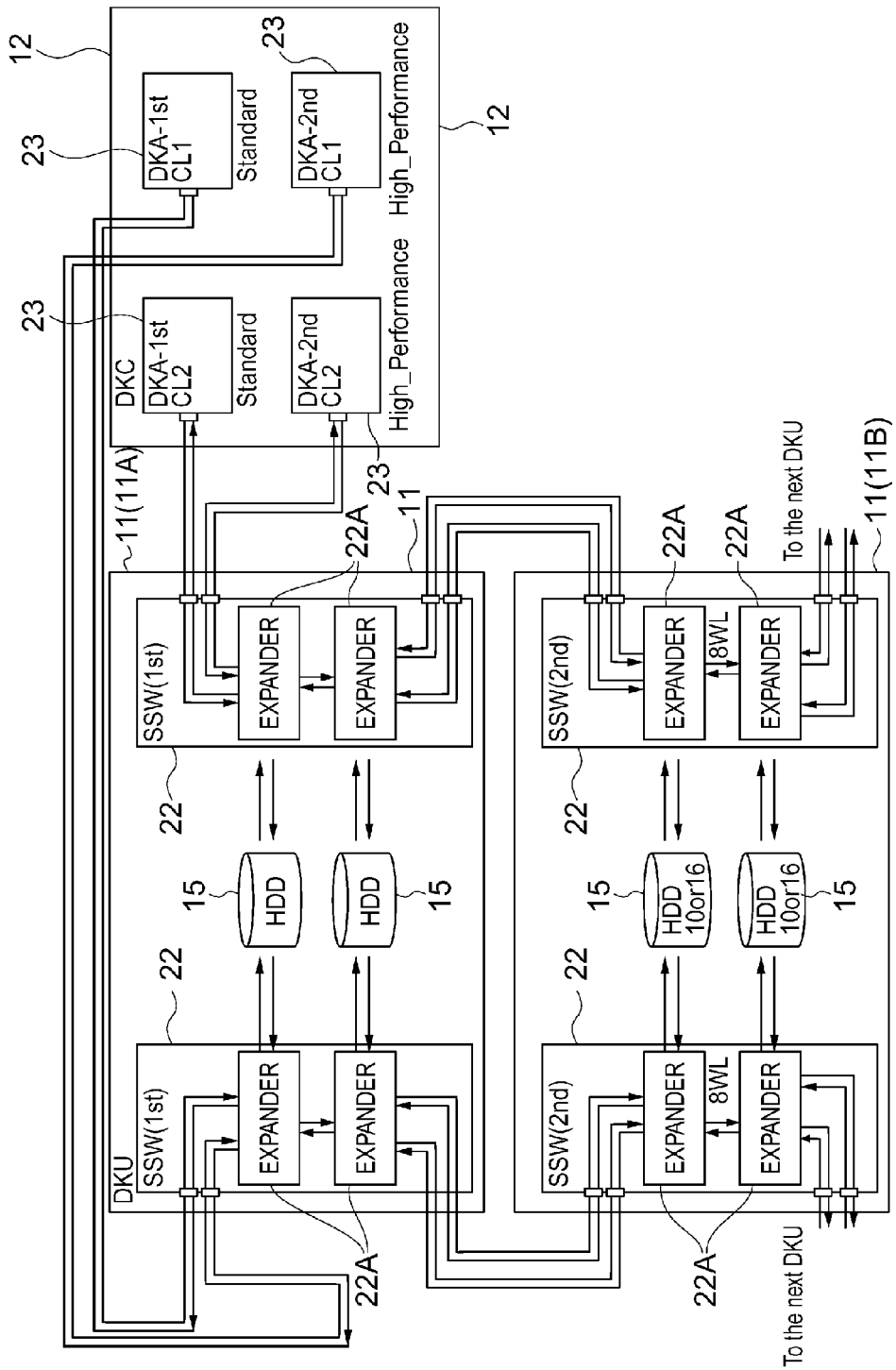
FIG. 43 is a connection diagram showing an example of the connection configuration between the disk controller and the disk units.

FIG. 43 shows a connection configuration example for the disk controller 12 and the disk units 11. The storage apparatus 1 is equipped with one disk controller 12 and two disk units 11 as described earlier. The disk controller 12 is equipped with four disk adapter packages 23. The disk adapter package 23 is connected to the switch package 22 for the disk unit 11. The switch package 22 is equipped with, for example, two expanders 22A and each expander 22A has many ports and is connected via the ports to each hard disk drive 15.

(10) Canister Configuration (10-1) Entire Configuration

Figure 44:
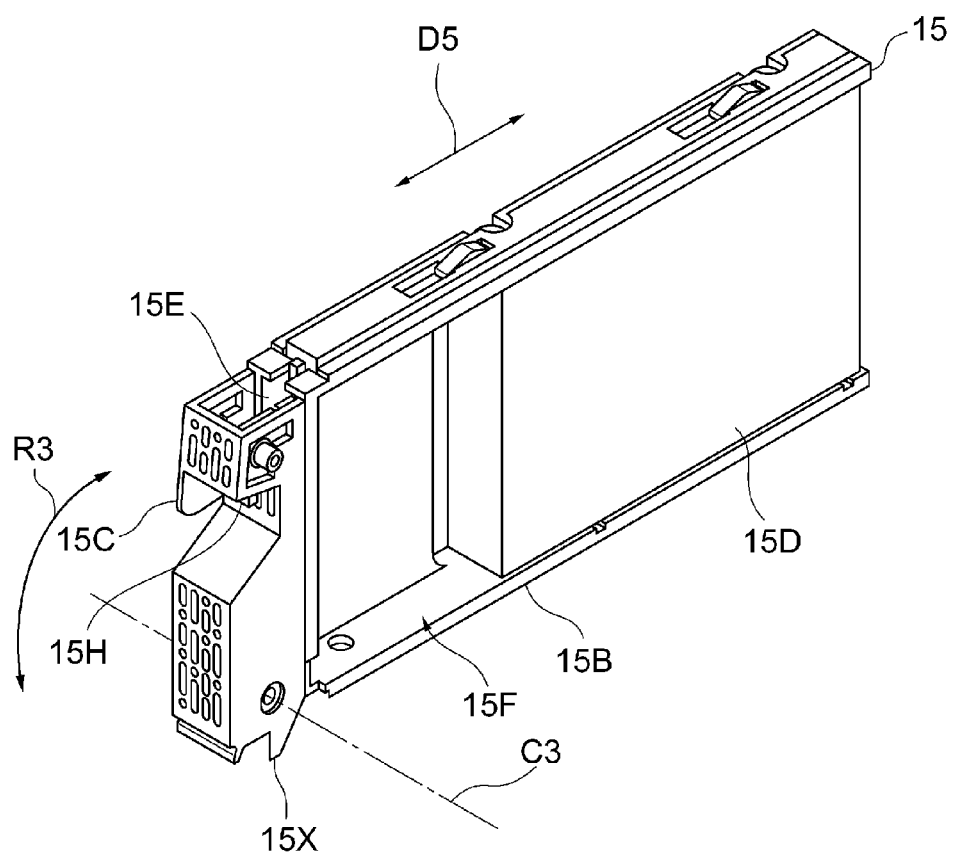
FIG. 44 is a perspective view showing an example of a canister configuration of the hard disk drive.
Figure 45:
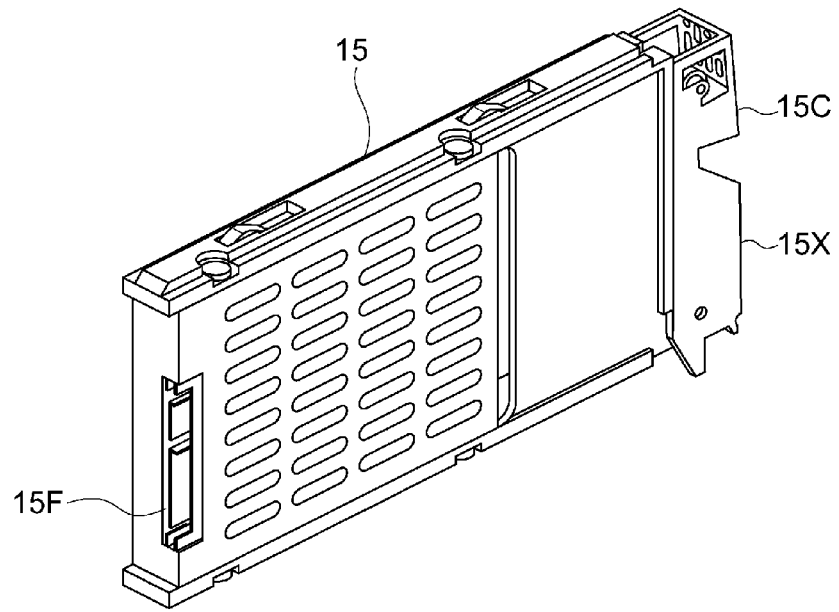
FIG. 45 is a perspective view showing an example of the canister configuration of the hard disk drive.

Each of FIG. 44 and FIG. 45 shows an example of a canister configuration of the hard disk drive 15. The hard disk drive 15 is configured so that it can be placed in the container in the aforementioned hard disk box 7. The hard disk drive 15 has a handle 15X and a chassis 15B as shown in FIG. 44. The chassis 15B is a thin, generally rectangular parallelepiped member that is approximately 16 m thick. The chassis 15B includes a disk body 15B containing, for example, 2.5 inch hard disk. The disk body 15D has a recess 15F formed in the area where the chassis 15B does not exist.

The handle 15X is formed on one end face of the chassis 15B relative to an insertion-removal direction D5. Many air holes are formed in the handle 15X in order to enhance the cooling efficiency. The handle 15X is configured so that it can rotate in R3 directions around axis C3 relative to the chassis 15B. When the handle 15X is rotated so that it comes into close contact with the chassis 15B, a hook 15E gets caught in the chassis 15B as described below. A latch 15H is formed on the handle 15X.

The latch H is an operating part for releasing the locked state caused by the hook 15E caught in the chassis 15B. Since the latch 15H is of a push style, it is possible to minimize the operation range. The hard disk drive 15 in the canister configuration is configured so that it cannot be pulled out of the container unless not only the latch 15H, but also the handle 15X is operated. The removal of the hard disk drive 15 can be permitted only after these two-step operations. Therefore, it is possible to prevent the hard disk drive 15 from being mistakenly inserted into, or pulled out of, the container.

Furthermore, a rib 15C is provided near the latch 15H. The rib 15C is a portion of the handle 15X that prevents fingers of the operator when operating the latch H from touching the adjacent canister by mistake and also from operating the handle 15X of another hard disk drive 15 which is in operation.

A SATA connector 15F is provided on the other end face (second end face) of the chassis 15B relative to the insertion-removal direction D5 as shown in FIG. 45. When the hard disk drive 15 is inserted into a guide portion (not shown) in the hard disk box 7, the SATA connector 15F is connected to the SATA connector 6C on the back board 6D placed behind the hard disk box 7.

Figure 46:
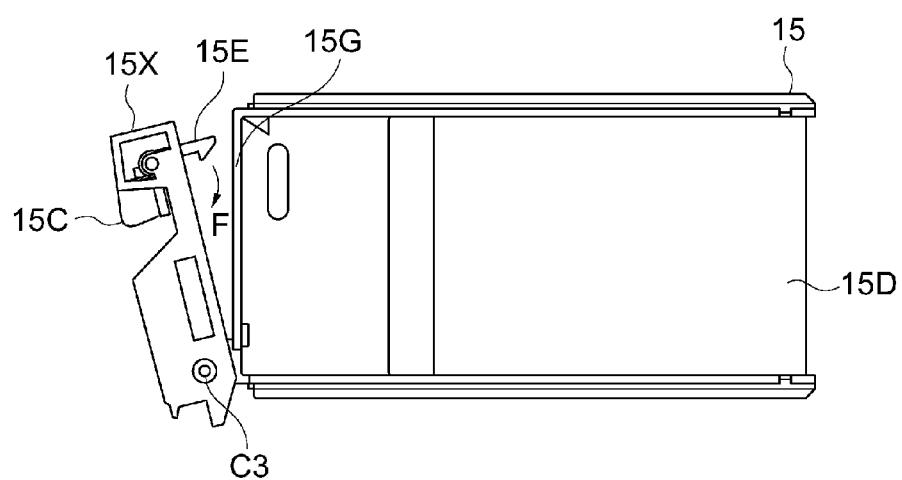
FIG. 46 is a side view showing an operation example for a handle.
Figure 47:
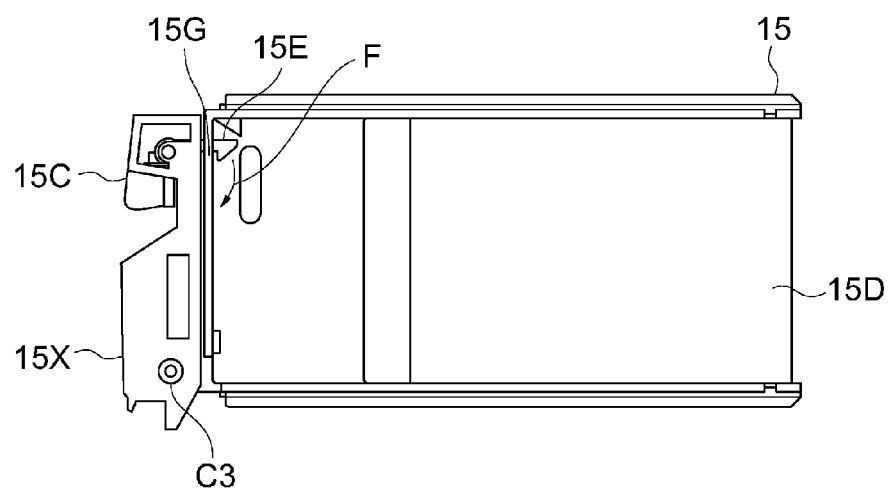
FIG. 47 is a side view showing an operation example for the handle.

Each of FIG. 46 and FIG. 47 shows an operation example for the handle 15X. The force is applied to the hook 15E toward an F direction as shown in FIG. 46, and the hook 15E is exposed when the handle 15X is released from the body 15D. On the other hand, when the handle 15X is attached to the body 15D as shown in FIG. 47, the hook 15E engages with the fixing member 15G formed on the first end face of the chassis 15B. As a result, the handle 15X is fixed to the chassis 15B.

(10-2) Insertion and Removal Operation

By pressing the latch 15H to release the locked state, the handle 15X rotates around axis C3 in the R3 direction and is then inclined. If the inclined handle 15X is further pulled down in the R3 direction, the hard disk drive 15 in the canister configuration can be pulled out of the container. On the other hand, the hard disk drive 15 is inserted in a reverse procedure to the above procedure, that is, by pushing the hard disk drive 15 with the handle 15X in the inclined state, so that the SATA connector 15F will be connected to the SATA connector 6C on the back board 6 described earlier.

The above-described configuration is used because the hard disk drive 15 is added to or removed from the storage apparatus 1 which uses the RAID configuration, while the storage apparatus 1 is in the on state, so that it is necessary to secure safe maintenance work. If the above-described canister configuration is used, it is possible to reduce pipe resistance and make it easier to work in a small space.

(11) Advantageous Effects of the Present Embodiment

According to the present embodiment as described above, a storage apparatus 1 includes: a general purpose chassis 20 having a space in its front face and a space in its back face; a plurality of openable first fan assemblies 10 (corresponding to the first cooling devices) provided so as to face the front face of the general purpose chassis 20; a plurality of openable second fan assemblies 10 (corresponding to the second cooling devices) provided so as to face the back face of the general purpose chassis 20; a front disk unit 11 for receiving a first modular 124 that is inserted from the front face of the general purpose chassis 20 into the space with the plurality of first fan assemblies 10 in an opened state, and in which a plurality of first hard disk boxes 7 (corresponding to containers) are formed, each hard disk box 7 receiving a plurality of first hard disk drives 15; a rear disk unit 11 for receiving a second modular 126 that is inserted from the back face of the general purpose chassis 20 into the space with the plurality of second fan assemblies 10 in an opened state, and in which a plurality of second hard disk boxes 7 are formed, each second hard disk box 7 receiving a plurality of second hard disk drives 15; and an open-close regulating member 99 for regulating, according to the open-close state of one fan assembly 10 in the front disk unit 11 and the rear disk unit 11, the open-close state of the remaining fan assemblies 10.

With this arrangement, many hard disk drives 15 can be loaded onto the storage apparatus 1 from its front face and back face, so that it is possible to realize high-density implementation and make it easier to perform the maintenance work. Also, the cooling ability during the maintenance work can be kept at a certain level or higher by regulating the plurality of fan assemblies 10 to prevent them from opening unnecessarily. As a result, the storage apparatus 1 can secure stable cooling performance.

The storage apparatus 1 according to the present embodiment includes a lock mechanism 100 for regulating the open operation of the plurality of fan assemblies 10 in the front disk unit 11 and permitting the open operation of the plurality of fan assemblies 10 in the rear disk unit 11, or for permitting the open operation of the plurality of fan assemblies 10 in the front disk unit 10 and regulating the open operation of the plurality of fan assemblies 10 in the rear disk unit 10.

If this configuration is used, the cooling ability during the maintenance work can be secured to a certain degree by regulating the plurality of fan assemblies 10 in either the front disk unit 11 or the rear disk unit 11 to prevent them from opening unnecessarily.

The storage apparatus 1 according to the present embodiment includes: a first power source 32 mounted between the pluralities of first hard disk boxes 7 so as to extend from the front face side toward the back face side, for supplying electric power to the plurality of first hard disk drives 15; a second power source 32 mounted between the pluralities of second hard disk boxes 7 so as to extend from the back face side toward the front face side, for supplying electric power to the plurality of second hard disk drives 15; and a bypass chamber 9 provided between the pluralities of hard disk boxes 7 so as to extend from the front face side toward the back face side along the first power source 32.

With this arrangement, the air, introduced by the fan assemblies 10 from the front face, flows into two systems. The first flow passes through the hard disk boxes 7, while the second flow passes through the specified chamber 9. Consequently, the air which has passed through the specified chamber 9 is not used to cool the hard disk drives 15 mounted in the front disk unit 11. In the rear disk unit 11, the air, which has passed through the specified chamber 9 and has not been used to cool the hard disk drives 15, is used so that the mounted hard disk drives 15 can be cooled efficiently, using the fan assemblies 10.

The storage apparatus 1 according to the present embodiment includes: a back board 6D which serves as a first board for mounting the first modular 124 and is provided at a position behind the front disk unit 11 as seen from the front face; a back board 6E which serves as a second board for mounting the second modular 126 and is provided at a position behind the rear disk unit 11 as seen from the back face; and another chamber 90 formed between the back boards 6D and 6E and connected to the bypass chamber 9.

The disk unit 11 according to the present embodiment has a switch 10A (corresponding to a detector) for detecting that any one of the plurality of fan assemblies 10 is opened; and as triggered by the switch 10A detecting that any one of the plurality of fan assemblies 10 is opened, the disk unit 11 controls output of the remaining cooling devices 10 which are not opened from among the plurality of fan assemblies 10.

As triggered by the switch 10A detecting that the fan assembly 10 is closed, the disk unit 11 sets the remaining fan assemblies 10 to normal output.

According to the present embodiment, the first modular 124 is provided with a plurality of first containers 15A on both sides of the first power source 32 as seen from the front face; and the second modular 126 is provided with a plurality of second containers 15A on both sides of the second power source 32 as seen from the back face.

With this arrangement, the hard disk drives 15 can be prioritized to be cooled in consideration of a difference in the amount of heat generation of the hard disk drives 15 and the power sources 32 which are located separately.

According to the present embodiment, the bypass chamber 9 and the first power source 32 are arranged in a vertical direction between the pluralities of first containers 7 so that one of them is placed on top of the other. Specifically speaking, at least one bypass chamber 9 is placed opposite at least one first power source 32 in the vertical direction when they are piled; and if there is more than one bypass chamber 9 or first power source 32, the bypass chambers 9 hold one first power source 32 between them or the first power sources 32 hold one power source 32 between them.

With this arrangement, it is possible to provide the configuration that effectively utilize the spaces in the storage apparatus 1 and efficiently cool the hard disk drives 15 in the rear disk unit 11.

When a RAID group is composed of a plurality of hard disk drives 15 in the front face of the chassis 20 and a plurality of hard disk drives 15 in the back face of the chassis 20 according to the present invention, each fan assembly 10 is located as follows: each of a plurality of fans 10E for the fan assemblies 10 on the front chassis of an additional chassis is placed opposite the plurality of hard disk drives 15 in the front face of the additional chassis and each of a plurality of fans 10E for the fan assemblies 10 on the back face of the additional chassis is placed opposite the plurality of hard disk drives 15 on the back face of the additional chassis.

With this arrangement, it is possible to minimize the influence on the RAID group when a failure occurs in the fan assembly 10.

if a RAID group is composed of a plurality of hard disk drives 15 arranged in the vertical direction, a plurality of the front fan assemblies 10 are arranged in the vertical direction, and a plurality of the rear fan assemblies 10 are arranged in the vertical direction.

With this arrangement, it is possible to control the number of times the fan assembly(ies) 10 opens and closes when a set of the hard disk drives 15 is added on a RAID group basis.

(12) Other Embodiments

The above-described embodiments are examples given for the purpose of describing the present invention, and it is not intended to limit the invention only to these embodiments. Accordingly, the present invention can be utilized in various ways unless the utilizations depart from the gist of the invention. For example, processing sequences of various programs have been explained sequentially in the embodiments described above; however, the order of the processing sequences is not particularly limited to that described above. Therefore, unless any conflicting processing result is obtained, the order of processing may be rearranged or concurrent operations may be performed.

REFERENCE SIGNS LIST

1 Storage apparatus
7 Hard disk box
9 Chamber
10 Fan assembly
10E Fan
11 Disk unit
12 Disk controller
15 Hard disk drive
15A Container
15X Handle
20 Rack
90 Intermediate chamber

The invention claimed is:
1. A storage apparatus comprising:
a general purpose chassis having a front space in its front face and a back space in its back face;
a plurality of openable first cooling devices provided so as to face the front face of the general purpose chassis;
a plurality of openable second cooling devices provided so as to face the back face of the general purpose chassis;
front disk unit for receiving a first modular unit, which is inserted from the front face of the general purpose chassis into the front space with the plurality of first cooling devices in an opened state, and in which a plurality of first containers receiving a plurality of first storage devices are formed;
rear disk unit for receiving a second modular unit, which is inserted from the back face of the general purpose chassis into the back space with the plurality of second cooling devices in an opened state, and in which a plurality of second containers receiving a plurality of second storage devices are formed;
a lock mechanism which regulates an open operation of the plurality of first cooling devices and permits the open operation of the plurality of second cooling devices in a first state, and permits the open operation of the plurality of first cooling devices and regulates the open operation of the plurality of second cooling devices in a second state; and a support member disposed across the front space and back space in the general purpose chassis, wherein the lock mechanism has a plate member with a first stepped portion at a first end thereof in the front space and a second stepped portion at a second end thereof in the back space, and the first stepped portion regulates and open operation of the first cooling devices by contacting the support member and the second stepped portion regulates and open operation of the second cooling devices by contacting the support member.

2. The storage apparatus according to claim 1, further comprising:

a first power source mounted between the plurality of first containers so as to extend from the front face side toward the back face side, for supplying electric power to the plurality of first storage devices;

second power source mounted between the plurality of second containers so as to extend from the back face side toward the front face side, for supplying electric power to the plurality of second storage devices; and specified chamber provided between the plurality of first containers so as to extend from the front face side toward the back face side along the first power source.

3. The storage apparatus according to claim 2, further comprising:

a first board for mounting the first modular unit, the first board placed at a position behind the front disk unit as seen from the front face;

a second board for mounting the second modular unit, the second board placed at a position behind the rear disk unit as seen from the back face; and another chamber formed between the first board and the second board and connected to the specified chamber.

4. The storage apparatus according to claim 1, wherein the disk unit has a detector for detecting that any one of the plurality of first cooling devices and the plurality of second cooling devices is opened, and wherein as triggered by the detector detecting that any one of the plurality of first cooling devices and the plurality of second cooling devices is opened, the disk unit controls output of the remaining cooling devices which are not opened from among the plurality of first cooling devices and the plurality of second cooling devices.

5. The storage apparatus according to claim 4, wherein as triggered by the detector detecting that one of the cooling devices is closed, the disk unit sets the remaining cooling devices to normal output.

6. The storage apparatus according to claim 2, wherein the first modular unit is provided with the plurality of first containers on both sides of the first power source as seen from the front face; and the second modular unit is provided with the plurality of second containers on both sides of the second power source as seen from the back face.

7. The storage apparatus according to claim 6, wherein the specified chamber and the first power source are arranged in a vertical direction between the plurality of first containers so that one of them is placed on top of the other.

8. The storage apparatus according to claim 1, wherein a RAID group is composed of the plurality of first storage devices in the front face of the general purpose chassis and the plurality of second storage devices in the back face of the chassis, each of a plurality of cooling parts for the first cooling devices is placed opposite the plurality of first storage devices on the front face of the chassis and each of a plurality of cooling parts for the second cooling devices is placed opposite the plurality of second storage devices on the back face of the chassis.

9. The storage apparatus according to claim 1, wherein a RAID group is composed of the first and second storage devices arranged in a vertical direction, and a plurality of cooling parts for the first cooling devices are arranged in the vertical direction and a plurality of cooling parts for the second cooling devices are arranged in the vertical direction.

* * * * *